(12) United States Patent
Katam et al.

(10) Patent No.: US 10,707,873 B2
(45) Date of Patent: Jul. 7, 2020

(54) SUPERCONDUCTING MAGNETIC FIELD PROGRAMMABLE GATE ARRAY

(71) Applicant: UNIVERSITY OF SOUTHERN CALIFORNIA, Los Angeles, CA (US)

(72) Inventors: Naveen Katam, Los Angeles, CA (US); Oleg Mukhanov, Los Angeles, CA (US); Massoud Pedram, Los Angeles, CA (US)

(73) Assignees: University of Southern California, Los Angeles, CA (US); SeeQC, Elmsford, NY (US)

( * ) Notice: Subject to any disclaimer, the term of this patent is extended or adjusted under 35 U.S.C. 154(b) by 0 days.

(21) Appl. No.: 16/360,835

(22) Filed: Mar. 21, 2019

(65) Prior Publication Data

US 2019/0296743 A1 Sep. 26, 2019

Related U.S. Application Data

(60) Provisional application No. 62/646,173, filed on Mar. 21, 2018.

(51) Int. Cl.
| | |
|---|---|
| H03K 19/17736 | (2020.01) |
| G06F 1/04 | (2006.01) |
| H03K 19/17728 | (2020.01) |
| H03K 19/195 | (2006.01) |

(52) U.S. Cl.
CPC ......... H03K 19/1774 (2013.01); G06F 1/04 (2013.01); H03K 19/17728 (2013.01); H03K 19/195 (2013.01)

(58) Field of Classification Search
CPC ... H03B 9/10; H03K 3/57; H03K 3/78; H03K 17/082; H03C 5/04; H03L 5/02; H01J 25/50; H01J 37/32201
USPC .................................................. 326/3
See application file for complete search history.

(56) References Cited

U.S. PATENT DOCUMENTS

| | | | |
|---|---|---|---|
| 9,595,970 B1* | 3/2017 | Reohr | H03K 19/195 |
| 2017/0076787 A1* | 3/2017 | Frank | G06N 10/00 |
| 2017/0104491 A1* | 4/2017 | Shauck | H03K 19/195 |
| 2018/0275193 A1* | 9/2018 | Rouge | H03K 19/17728 |
| 2019/0019938 A1* | 1/2019 | Braun | G06N 10/00 |
| 2019/0220771 A1* | 7/2019 | Boothby | G06F 15/80 |
| 2019/0296743 A1* | 9/2019 | Pedram | H03K 19/1774 |

* cited by examiner

*Primary Examiner* — Don P Le
(74) *Attorney, Agent, or Firm* — Brooks Kushman P.C.

(57) ABSTRACT

A superconducting field programmable gate array (SuperFPGA) apparatus for implementing a superconducting electronic circuit includes a superconducting logic core that includes a plurality of superconducting single flux quantum configurable logic blocks having regular Josephson junctions and inductors that are interconnectible to each other and to input/output terminals of the superconducting electronic circuit. The SuperFPGA apparatus also includes a superconducting routing network, a zero-static-power dissipation biasing network, magnetic Josephson junctions, and a magnetic Josephson junction programming layer.

33 Claims, 16 Drawing Sheets

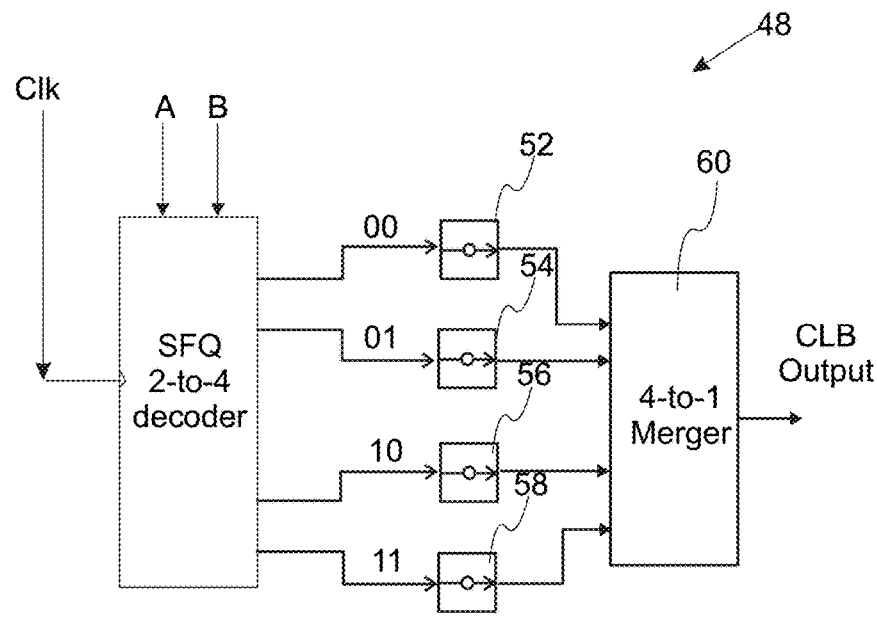
*Fig. 4A*
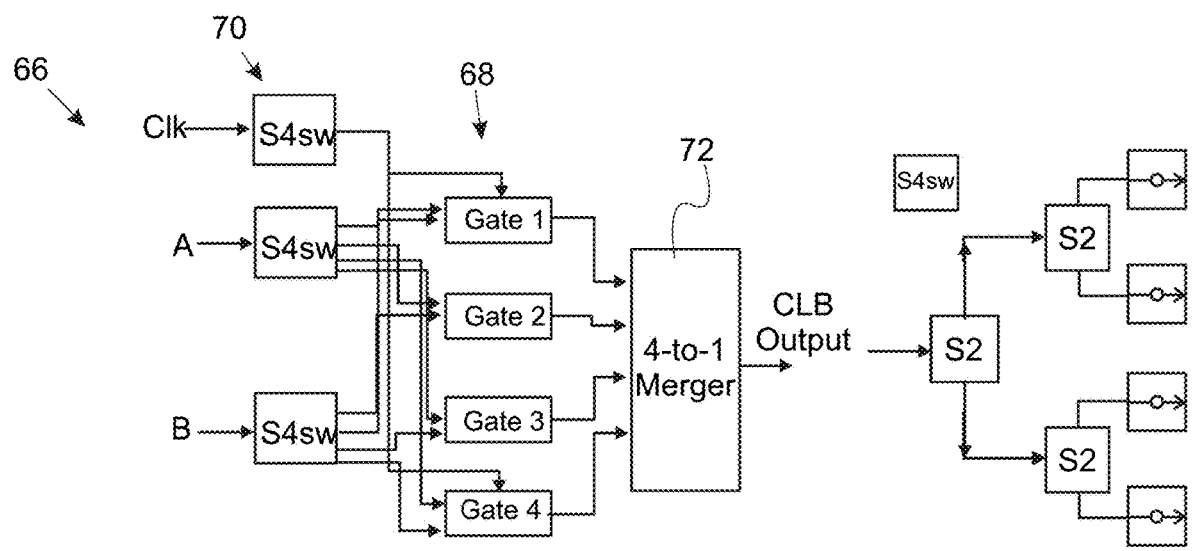
*Fig. 4B*          *Fig. 4C*

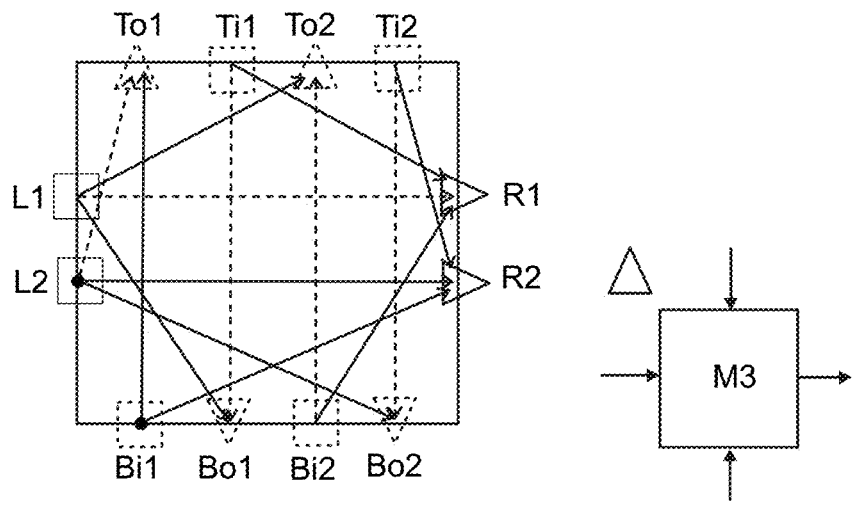
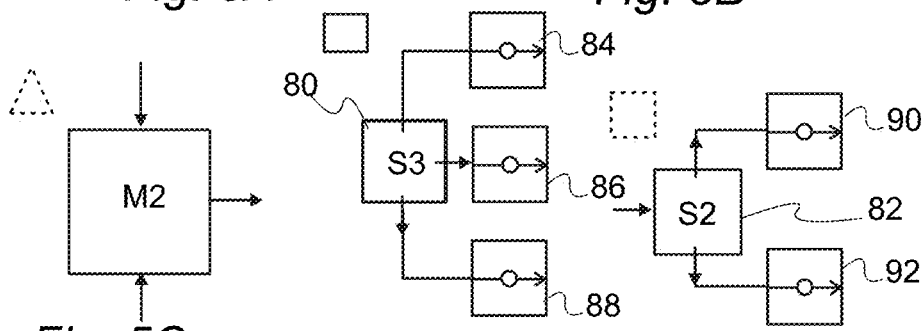
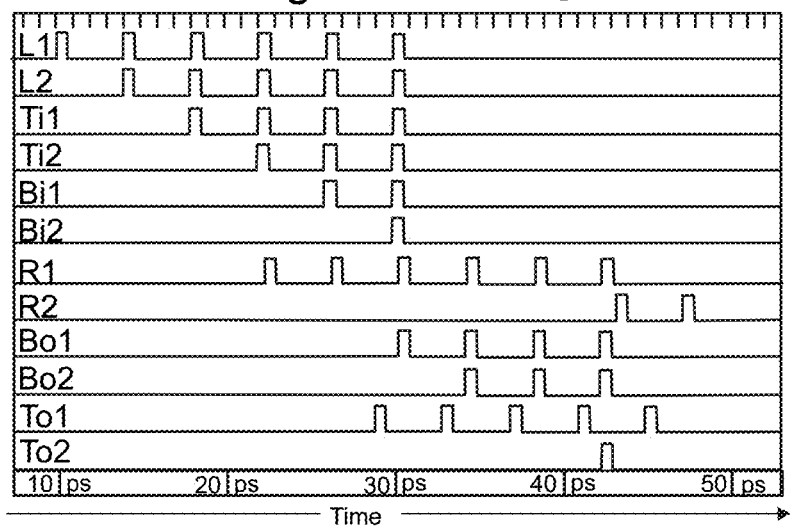
Fig. 5A  Fig. 5B  Fig. 5C  Fig. 5D  Fig. 5E
Fig. 5F

SUPERCONDUCTING MAGNETIC FIELD PROGRAMMABLE GATE ARRAY

CROSS-REFERENCE TO RELATED APPLICATIONS

This application claims the benefit of U.S. provisional application Ser. No. 62/646,173 filed Mar. 21, 2018, the disclosure(s) of which is(are) hereby incorporated in its (their) entirety by reference herein.

TECHNICAL FIELD

In at least one aspect, the present invention relates to field programmable gate arrays having superconducting components.

BACKGROUND

A significant improvement in the energy efficiency of digital technology is required to enable further progress in information systems in the wake of considerable scaling challenges facing conventional CMOS [1]. Superconducting single flux quantum (SFQ) technology is capable of very low power dissipation and high speed, and thus, has been attracting a great deal of attention as a potential beyond CMOS technology candidate for energy-efficient computing systems [2], [3]. Cryogenic rapid SFQ (RSFQ) circuits [4] have already reached a relative maturity realizing critical digital processing circuits [5]-[7] and producing integrated circuits of commercial significance [8]. Recently, SFQ technologies with even higher energy efficiency have been developed [9]-[14]. Still, a big leap is required for SFQ technologies to have integrated circuits reaching complexities and integration densities on par with the mature CMOS technology. A serious challenge for SFQ technologies is its relatively low integration density determined by the large geometries of superconducting quantum interferometer devices (SQUIDs) typical for SFQ circuits.

One of the most successful circuits in the semiconductor industry is field-programmable gate arrays (FPGAs) [15]. They are prefabricated CMOS circuits that can be electrically programmed on the field to become any circuit or system, as per the requirement of the user. Typically, FPGA is a cheaper and faster solution when compared to application specific integrated circuits, especially for the new circuit designs in the research and development phase [16]. Recently, a cryogenically cooled CMOS FPGA was used to implement a classical controller for quantum computing processors [17], [18] despite the dissipation a significant amount of power. The circuit energy efficiency is a priority for quantum computing applications requiring the cryogenic placement of FPGAs. Clearly, a superconducting energy-efficient FPGA would be an attractive option.

The first superconducting FPGA based on RSFQ logic was proposed in 2007 [19]. It relied on the implementation of switches based on a derivative of a non-destructive readout (NDRO) circuit controlled by dc bias to program the routing and the lookup tables (LUT) used to implement a configurable logic block in the FPGA fabric. The LUT-based configurable logic block could be programmed to implement any Boolean function of up to k inputs for a fixed and small value of k e.g., k=2. As a result, the total area used by switches occupied 65% of the total chip area. It also proposed the use of transformer coupling to control switches, which at a large scale can potentially cause yield and crosstalk issues. Recently, another superconducting FPGA was proposed [20] based on reciprocal quantum logic [12] and switchable phase shifters based on magnetic Josephson junctions (MJJs) embedded into dc SQUIDs. Although a complete operation or a detailed FPGA design was not elaborated, the use of SQUID-based switches and the combination of voltage-state (multi-SFQ) and SFQ signal regimes would make a future implementation of such FPGA challenging in achieving a high circuit density and energy efficiency.

Accordingly, there is a need for alternative and improved designs for FPGAs using superconducting components.

SUMMARY

In at least one aspect, the present invention provides a new and complete SFQ FPGA design describing all the necessary circuit blocks. It is based on energy-efficient RSFQ (ERSFQ) logic [10] with programmable dc biasing controlled by MJJs. This new approach allows us to avoid the use of SQUID- and NDRO-based switches and achieve a much higher area efficiency. In MIT Lincoln laboratory (MIT-LL) process, the typical area of an NDRO gate combined with a single JTL stage at input and output pins (I/O JTL) is 40×60 $\mu m^2$. In contrast, the typical area of an MJJ is 2×2 $\mu m^2$ and combined with its associated bias lines, a total area of 3×3 $\mu m^2$. Similarly, bias current required for the operation of an NDRO-based switch is at least 1500 $\mu A$. In contrast, an MJJ-based switch can be implemented as part of an I/O JTL without any additional bias current. We present two types of configurable logic blocks (CLBs) that work in the LUT-based architecture and any special SFQ function based architecture.

In another aspect, a superconducting field programmable gate array (SuperFPGA) apparatus for implementing a superconducting electronic circuit is provided. The SuperFPGA apparatus includes a superconducting logic core that includes a plurality of superconducting single flux quantum configurable logic blocks having regular Josephson junctions and inductors that are interconnectible to each other and to input/output terminals of the superconducting electronic circuit. The SuperFPGA apparatus also includes a superconducting routing network that includes a collection of transmission lines, programmable connection blocks, and programmable switchboxes for realizing connections among the superconducting single flux quantum configurable logic blocks and input/output terminals. A zero-static-power dissipation biasing network for supplies predetermined amounts of biasing currents to the superconducting logic core and superconducting routing network. Magnetic Josephson junctions are used selectively in the zero-static-power dissipation biasing network to enable in-field programmability of the superconducting logic core and superconducting routing network by changing amounts of locally-provided biasing currents. Finally, the SuperFPGA apparatus also includes a magnetic Josephson junction programming layer that has decoders and superconducting current-carrying lines to enable and effect selective setting of critical current levels of the magnetic Josephson junctions.

In another aspect, a method of enabling in-field programmability of a superconducting field programmable logic circuit is provided. The method includes a step of receiving programming data describing a desired functionality of the superconducting field programmable logic circuit. The programming data is decoded to produce a bit stream for programming individual configurable logic blocks and interconnections among configurable logic blocks and primary inputs/outputs of the superconducting field programmable logic circuit. The bit stream is processed by selectively changing a magnitude of a current flowing in a superconducting line to cause a change in a critical current level of a nearby magnetic Josephson junction. The change causes a corresponding a change in biasing current level supplied to a target superconducting programmable logic or interconnect element.

In yet another aspect, a feeding clock choking system in a superconducting electronic circuit is provided. The feeding clock choking system includes a plurality of circuit blocks within the superconducting electronic circuit, a plurality of magnetic Josephson junction-based switches placed at the start of the feeding Josephson Transmission lines for each of the said plurality of circuit blocks, and circuitry to program each of the said magnetic Josephson junction-based switches to stop propagation of the feeding clock when there is no circuit activity in a corresponding circuit block.

In still another aspect, a method of choking a feeding clock in a superconducting electronic circuit partitioned into a plurality of circuit blocks is provided. The method includes a step of placing a plurality of magnetic Josephson junction-based switches at the start of the feeding Josephson transmission lines for each of the said plurality of circuit blocks. Each of the said magnetic Josephson junction-based switches are programmed to stop propagation of the feeding clock when there is no circuit activity in a corresponding circuit block.

BRIEF DESCRIPTION OF THE DRAWINGS

FIGS. 4A, 4B, and 4C. MJJ-based magnetic CLBs: (A) LUT-based; (B) FS-based (triple-switch); (C) S4sw block: representation of four-way splitter with switches.

FIGS. 5A, 5B, 5C, 5D, 5E, and 5F. (A) Switch box implementation. Inputs and outputs are represented by red and green color labels, respectively. Dashed connection lines represent the programming of MJJ switches to let the pulse pass through them. (B)-(E) Representational figures: (B) Three signal merger. (C) Two signal merger. (D) Three-way splitter (S3) with attached switches at outputs. (E) Two-way splitter (S2) with switches. (F) Functional waveforms of Verilog HDL simulation of switch box for the programmed switches shown in (a) with dashed connection lines.

DETAILED DESCRIPTION

Figure 1:
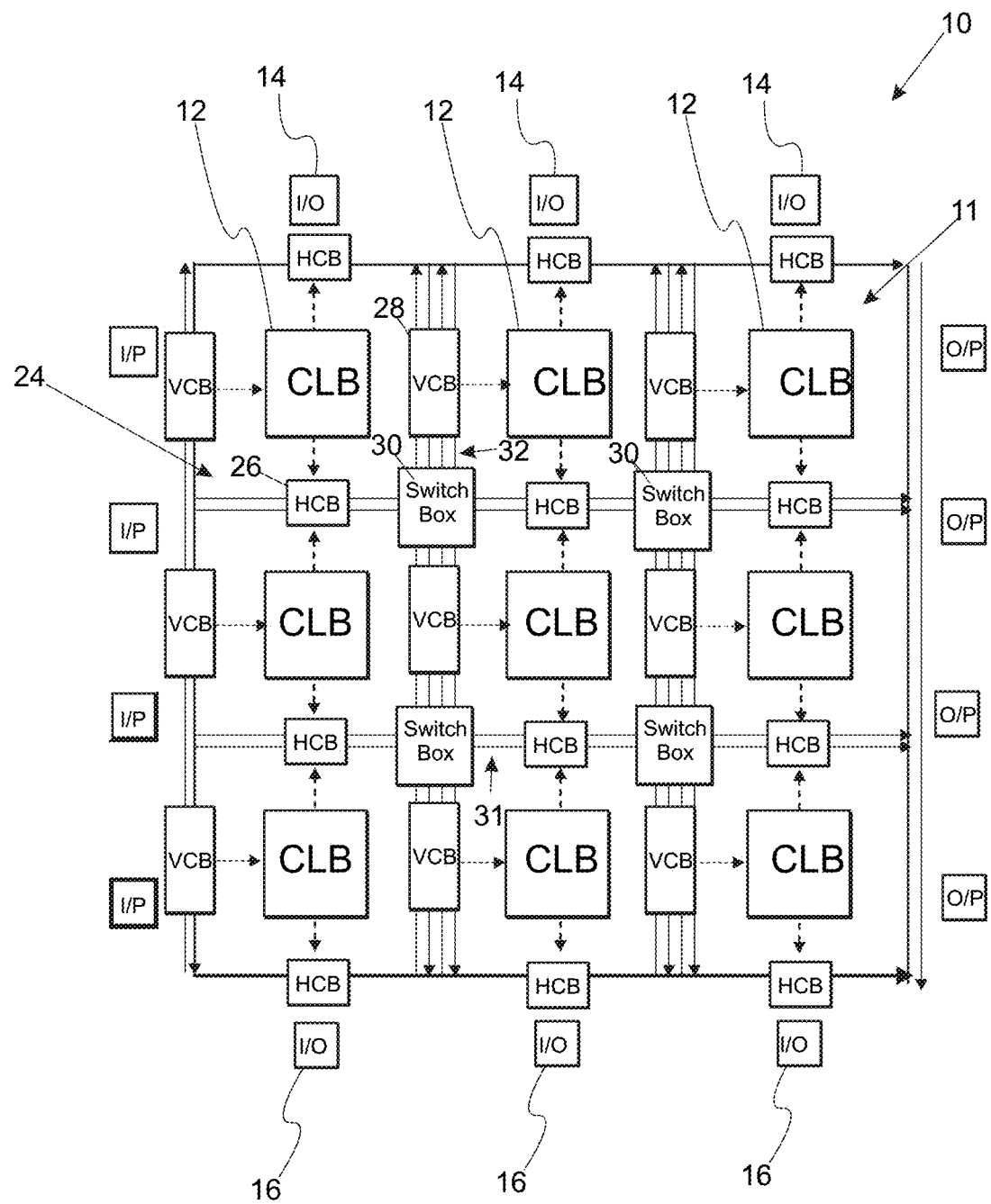
FIG. 1. Island-style architecture adaptation of SFQ FPGA with unidirectional and bidirectional data flow in horizontal and vertical directions, respectively. A CLB gets its inputs from the routing network through VCB and its outputs are carried to the routing network through HCB. I/P: Input, O/P: Output, I/O: Input/Output, CLB: Configurable logic block, VCB: Vertical Connection block, and HCB: Horizontal connection block.

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

Throughout this application, where publications are referenced, the disclosures of these publications in their entireties are hereby incorporated by reference into this application to more fully describe the state of the art to which this invention pertains.

Abbreviations:

"CLB" means configurable logic blocks.

"ERSFQ" means energy-efficient rapid single flux quantum.

"FPGA" means field-programmable gate arrays.

"HCB" means horizontal connection block.

"I/O" means input/output.

"JTL" means Josephson transmission line.

"LUT" means lookup table.

"MJJ" means magnetic Josephson junctions.

"NDRO" means non-destructive readout.

"PS" means program and store.

"RSFQ" means rapid single flux quantum.

"SFQ" means single flux quantum.

"SQUID" means superconducting quantum interferometer devices typical for SFQ circuits.

"SuperFPGA" means superconducting field programmable gate array.

"VCB" means vertical connection block.

In an embodiment, a superconducting field programmable gate array (SuperFPGA) apparatus for implementing a superconducting electronic circuit is provided. This superconducting electronic circuit can operate in a synchronous or asynchronous manner. As shown in FIG. 1, the SuperFPGA 10 includes a superconducting logic core 11 having a plurality of superconducting single flux quantum configurable logic blocks 12 interconnectible to each other and to input/output terminals 14, 16 of the superconducting electronic circuit. The superconducting logic core is organized as a regular array of superconducting single flux quantum configurable logic blocks 12 which is characteristic of the island-style configuration. In a refinement, logic core 11 is organized as a regular two-dimensional array of superconducting single flux quantum configurable logic blocks.

A superconducting routing network 24 includes a collection of transmission lines 24, programmable connection blocks 26, 28, and programmable switchboxes 30 for realizing connections among the configurable logic blocks and input/output terminals. The superconducting routing network 24 allows signal flow in horizontal or vertical directions in unidirectional or bidirectional manner. In a refinement, the superconducting routing network includes horizontal connection blocks 26 and vertical connection blocks 28. The horizontal connection blocks 28 receive data from connected vertical routing channels 31 and selectively send data as inputs to connected nearby configurable logic blocks. Similarly, vertical connection blocks 28 receive data from connected vertical routing channels 32 and selectively send data as inputs to connected nearby configurable logic blocks. That is, outputs of vertical connection blocks 28 are routed to inputs of configurable logic blocks 12 and outputs of the superconducting single flux quantum configurable logic blocks 12 are routed to inputs of horizontal connection blocks 28. Similarly, horizontal connection blocks 26 connect horizontal channels to nearby configurable logic blocks by selectively placing output(s) of configurable logic blocks on routing channels. Moreover, the superconducting routing network 24 can allow signal flow in horizontal or vertical directions in unidirectional or bidirectional manner. Notice that the passive or Josephson transmission lines may be partially or fully hidden inside the various connection blocks.

A zero-static-power dissipation biasing network supplies desired amounts of biasing currents to the configurable logic blocks, transmission lines, programmable connection blocks, and programmable switchboxes. FIG. 2 shows an example of a switch 34 using such a biasing network 36 with magnetic Josephson junction 38 as bias limiting junction. Magnetic Josephson junctions are used selectively in the superconducting logic core, superconducting routing network as part of zero-static-power dissipation biasing network to enable in-field programmability of logic and interconnect by changing the amounts of locally-provided biasing currents. In particular, magnetic Josephson junctions 38 are placed in an array where programming of their critical current level is achieved by controlling current flow through current-carrying lines of a cross-bar structure with each intersection points of the cross-bar corresponding to a specific magnetic Josephson junction of the array. FIG. 2 also shows that switch 34 includes a magnetic Josephson junction 38. In a refinement, the zero-static-power dissipation biasing network is an energy-efficient rapid single flux quantum biasing network.

Finally, a magnetic Josephson junction programming layer comprising of decoders and superconducting current-carrying lines to enable and effect the selective setting of critical current levels of the magnetic Josephson junctions. FIG. 3 illustrates a magnetic Josephson junction programming layer 40 that includes program decoders 42, 44 and superconducting current-carrying lines 46. These program decoders can be implemented using either superconducting circuits or CMOS circuits. Inputs to the program decoders can be provided either in parallel or serially.

Characteristically, the superconducting single flux quantum configurable logic blocks 12 are programmable to perform a specific Boolean operation by the magnetic Josephson junction programming layer. In this regard as depicted in FIG. 3, magnetic Josephson junctions are placed in an array where programming of their critical current level is achieved by controlling current flow through current-carrying lines of a cross-bar structure with each intersection points of the cross-bar corresponding to a specific magnetic Josephson junction in the array. In particular, the superconducting single flux quantum configurable logic blocks 12 are programmable to perform a specific Boolean operation by changing biasing currents through the magnetic Josephson junction programming layer.

The superconducting single flux quantum configurable logic blocks can be look-up table based or a function selectable type. In a variation as depicted in FIG. 4A, a lookup table based superconducting single flux quantum configurable logic block 48 includes a decoder 50 that can decode a maximum number of inputs that a gate can have and a plurality of magnetic Josephson junction-based switches 52, 54, 56, 58 such that a magnetic Josephson junction-based switch is placed at each decoder output to selectively block or pass decoded outputs. Each switch includes regular and magnetic Josephson junctions and inductors. A merge-block 60 merges the switch outputs to give a configurable logic block output. In particular, merge-block 60 merges the decoded outputs to realize Boolean function of the logic gate at an output of the superconducting single flux quantum configurable logic blocks.

In another variation as depicted in FIG. 4B, a function selectable based superconducting single flux quantum configurable logic block 66 includes a plurality of gates 68, a plurality of splitters 70 with switches that carry inputs to each of the predetermined number of gates, and a merger circuit 72 that mergers outputs from the gates to give a configurable logic block output. Each splitter 70 has a magnetic Josephson junction at each splitter output as depicted in FIG. 4C. Each switch includes regular and magnetic Josephson junctions and inductors to selectively block or pass signals.

In another variation, the programmable connection blocks and programmable switchboxes are programmable to provide selective connectivity among input or output routing channels and configurable logic blocks by the magnetic Josephson junction programming layer. In a variation as depicted in FIG. 5, the programmable switchboxes include splitters (e.g., splitters 80 or 82) having a splitter input and 2 or more splitter outputs. Each splitter output is directly connected to a magnetic Josephson junction-containing switch (e.g., switches 84-92). The programmable switchboxes can also include merger circuits that combines 2 or more input signals into a merged output signal such a merger circuit 60 of FIG. 4A.

In some variations, the SuperFPGA apparatus applies a distribution of clock pulses for synchronous circuit operation. Such distributions are realized by various clock distribution schemes, including zero-skew, concurrent flow, counter flow, and clock-follow-data. In a refinement, the clock pulse distribution for synchronous operation that is achieved using a clock-follow-data scheme such that logic circuits including logic gates are each mapped to a configurable logic block in the superconducting logic core in such a way that logic gates with a same logical depth lie in one or more consecutive columns of the regular two-dimensional array of superconducting single flux quantum configurable logic blocks. In another refinement, the clock-follow-data scheme can be used for reset-pulse distribution in case of operation in an asynchronous wave-pipelined manner.

In another embodiment, a method of enabling in-field programmability of a superconducting field programmable logic circuit is provided. The method includes a step of receiving programming data describing a desired functionality of the logic circuit. The programming data is decoded to produce a bit stream for programming individual logic cells and interconnections among cells and primary inputs/outputs of the logic circuit. The bit stream is processed by selectively changing the magnitude of a current flowing in a superconducting line to cause a change in the critical current level of a nearby magnetic Josephson junction, the change causing a corresponding a change in the biasing current level supplied to a target superconducting programmable logic or interconnect element. Examples of the individual logic cells that are programmed include the superconducting single flux quantum configurable logic blocks as set forth above. Similarly, additional details examples of the interconnections that are programmed include programmable connection blocks and programmable switchboxes that are set forth above.

Figure 6:
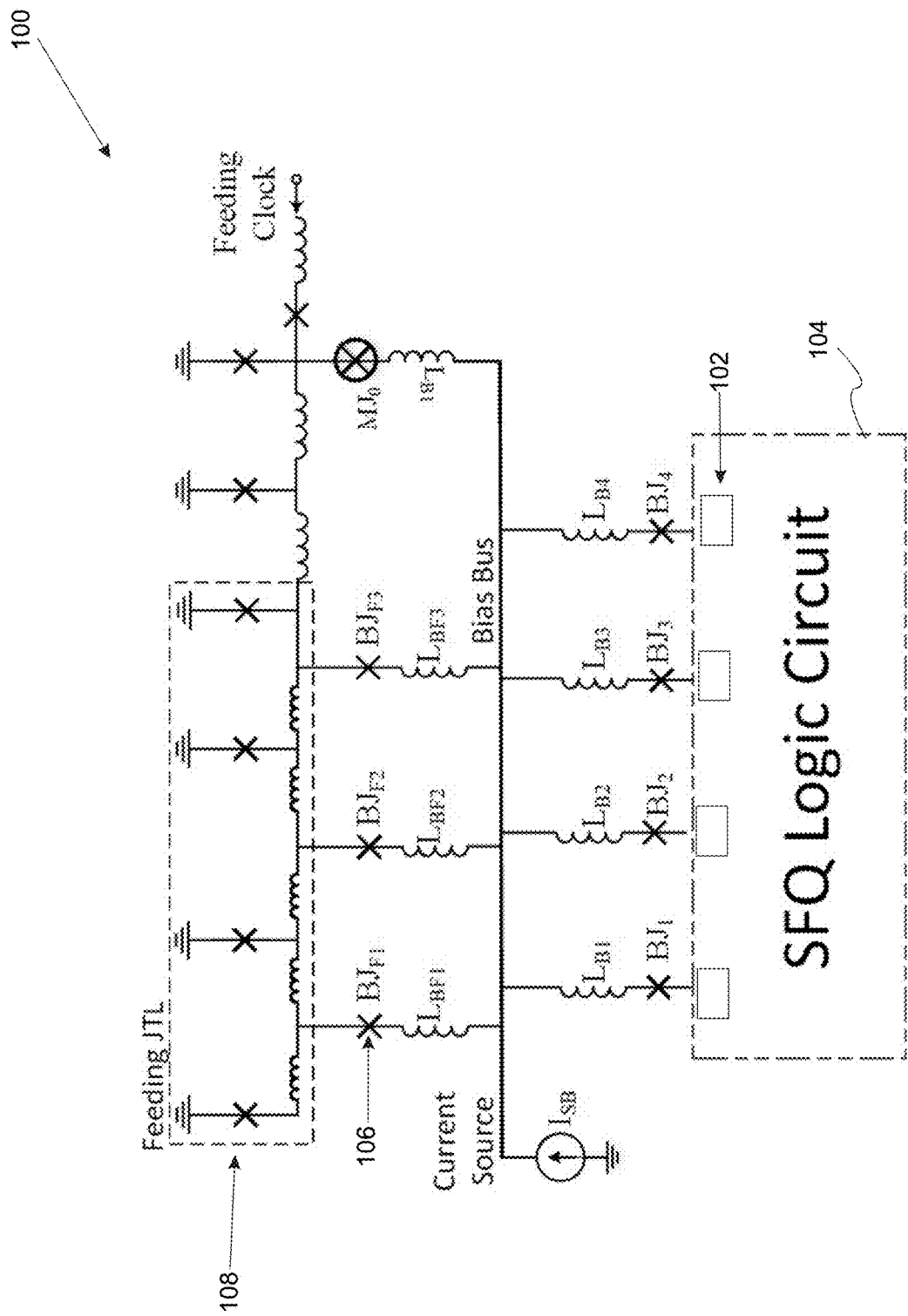
FIG. 6. Schematic of a feeding clock choking system.

In another embodiment, a feeding clock choking system in a superconducting electronic circuit is provided. With reference to FIG. 6, the feeding clock choking system 100 includes a plurality of circuit blocks 102 within the superconducting circuit 104, a plurality of magnetic Josephson junction-based switches 106 placed at the start of the feeding Josephson Transmission lines 108 for each of the said plurality of circuit blocks, and circuitry to program each of the said magnetic Josephson junction-based switches to stop the propagation of the feeding clock when there is no circuit activity in the corresponding circuit block. In this regard, ERSFQ biasing requires constant feeding of clock pulses to the FJTL to maintain a constant bias bus voltage. This accounts for an additional dynamic power consumption in both FJTL and all the bias-limiting JJs of the circuit but is necessary for the circuit to function with good margins. However, when there is no circuit activity in some parts of the circuit, this additional power consumption is a loss. If this dynamic power consumption can be avoided, not only is power saved, but also interference can be reduced from one part of the circuit to the other part.

The idea of feeding clock choking is to distribute the feeding clock separately to different sections of the circuit and stop the feeding clock to circuit blocks that do not have circuit activity. This way, we can implement the sleep regime for a section of the integrated circuit and save the unnecessary dynamic power dissipated in the absence of activity in this circuit. Therefore, magnetic Josephson junctions (MJJs) can be used to exploit the property of programmable critical current through the magnetization of the ferromagnetic layer of MJJs. A switch implementation shown in FIG. 2 can be placed at the beginning of the FJTL of each circuit block and be programmed to choke (stop the propagation) the feeding clock when there is no circuit activity in a circuit block.

The usefulness of choking the feeding clock can be realized effectively in implementing the current recycling technique for ERSFQ circuits. For current recycling, the circuit must be divided into several blocks of the similar bias current and be biased serially. Since the circuit is already divided into blocks, we can implement an MJJ based switch at the entrance of feeding clock for each block to implement the feeding clock choking. Whenever a certain block is not used in the circuit, the feeding clock for that block can be choked. It results in current entering and leaving the block without consuming any dynamic or static power. This makes the idle circuit blocks achieve zero power consumption. Superconducting FPGAs and memories are such circuits where it can be applied directly as the circuit is already divided into blocks with equal bias current.

Additional details of the feeding clock choking system are found in N. K. Katam, O. A. Mukhanov and M. Pedram, "Simulation Analysis and Energy Saving Techniques for ERSFQ Circuits," in *IEEE Transactions on Applied Superconductivity*. doi: 10.1109/TASC.2019.2904688; the entire disclosure of this reference is incorporated by reference.

It should be appreciated that the embodiments set forth herein are not limited by the superconducting materials being used. Examples of useful superconducting materials include, but are not limited to, niobium which has a critical temperature of about 9.3 Kelvin and niobium nitride which has a critical temperature of about 16 Kelvin. Details of RSFQ logic circuits that can be used in the embodiments herein is disclosed in "RSFQ Logic/Memory Family". K. K. Likharev and V. K. Semenov, IEEE Transactions on Applied Superconductivity, Vol. 1, pp. 3-28, March 1991; Katam, Naveen, Alireza Shafaei, and Massoud Pedram. "Design of complex rapid single-flux-quantum cells with application to logic synthesis." 2017 16th International Superconductive Electronics Conference (ISEC). IEEE, 2017; and Bunyk, Paul, Konstantin Likharev, and Dmitry Zinoviev. "RSFQ technology: Physics and devices." International journal of high speed electronics and systems 11.01 (2001): 257-305; the entire disclosures of these references are incorporated herein by reference. In general, the active device in the superconductive technology is a two-terminal Josephson junction (JJ). At the device level, JJs can be described as two superconductors weakly connected by an electrical contact such as an insulator (which forms an SIS junction). They exhibit the Josephson effect: flow of supercurrent by tunneling of Cooper pairs through the barrier between both superconductors. This supercurrent is a quantum-mechanical phenomenon and depends on Cooper pair electron wave functions and the coupling between both superconductors. Each junction has a critical current ($I_c$) value which depends on the process technology and the area of the junction. If current through a junction exceeds $I_c$, the junction exits the superconducting state and enters the normal state where a rather large voltage, is formed across the JJ. $\Phi_0$ represents a single quantum of superconducting flux. When JJ exits the superconducting state forming voltage V(t) whose value integrated over time gives flux of value $\Phi_0$ and returns to the superconducting state, the junction experiences a so-called $2\pi$-leap.

SFQ logic gates contain JJs, inductors, and resistors for shunting the junctions and biasing the circuits (if RSFQ). Josephson junctions SFQ is a pulse-based logic and there are two main operations of pulses that happen in cells and overall in the circuits: (i) pulse transfer and (ii) pulse storage. The circuit schematic netlist, the critical current of JJs and the inductance values are designed individually to get the operation of the required gate. Due to margin concerns, SFQ logic gates are currently limited to two-input (and some three-input) gates [1]. FIG. 7 provides illustrative examples showing the two main operations.

Figure 7A:
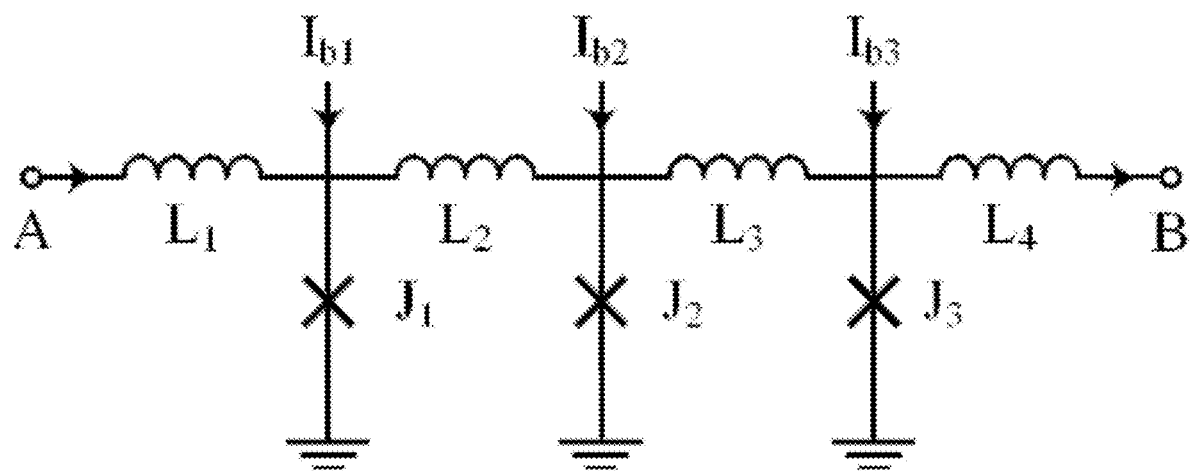
FIGS. 7A, 7B, 7C, and 7D. Schematics of (A) JTL (B) Splitter (C) SFQ D flip-flop (J1, J2 and L2 form an interferometer, whereas J0 and J3 mediate pulse propagation) (D) DFF simulation results.
Figure 7B:
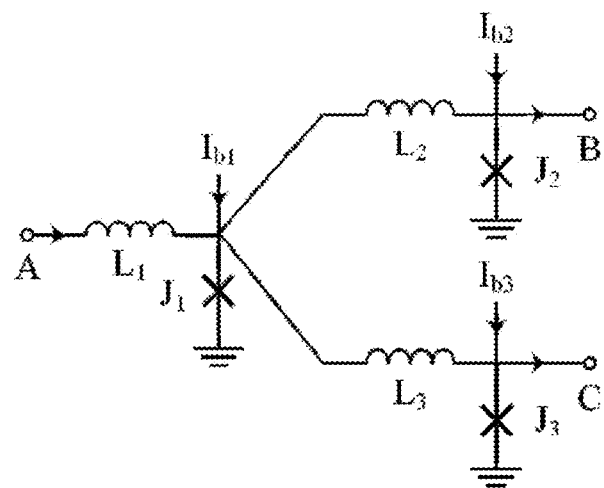
Figure 7C:
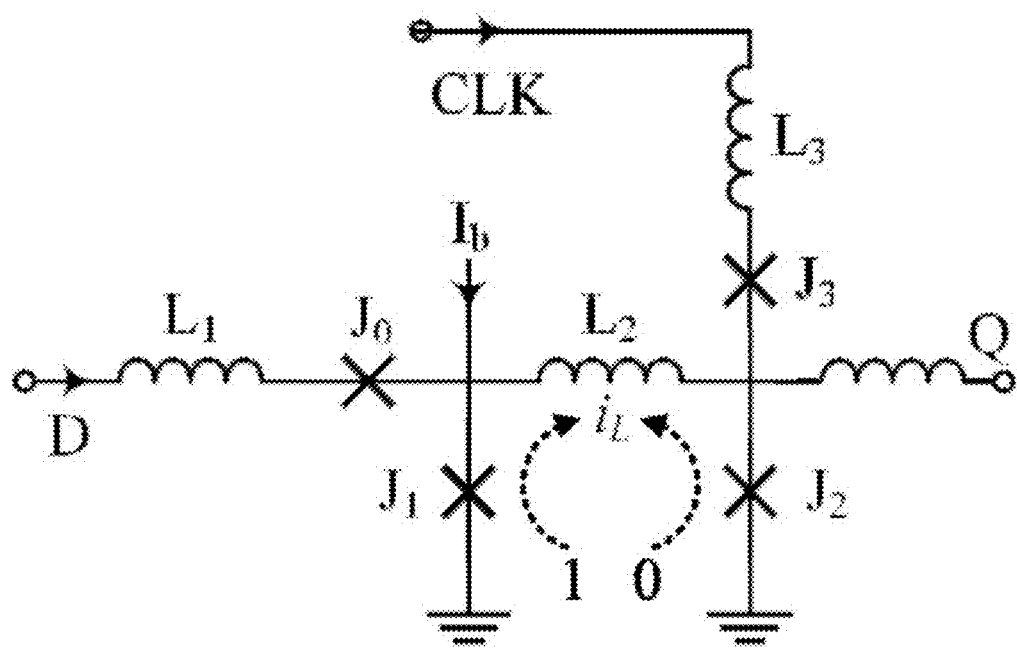
Figure 7D:
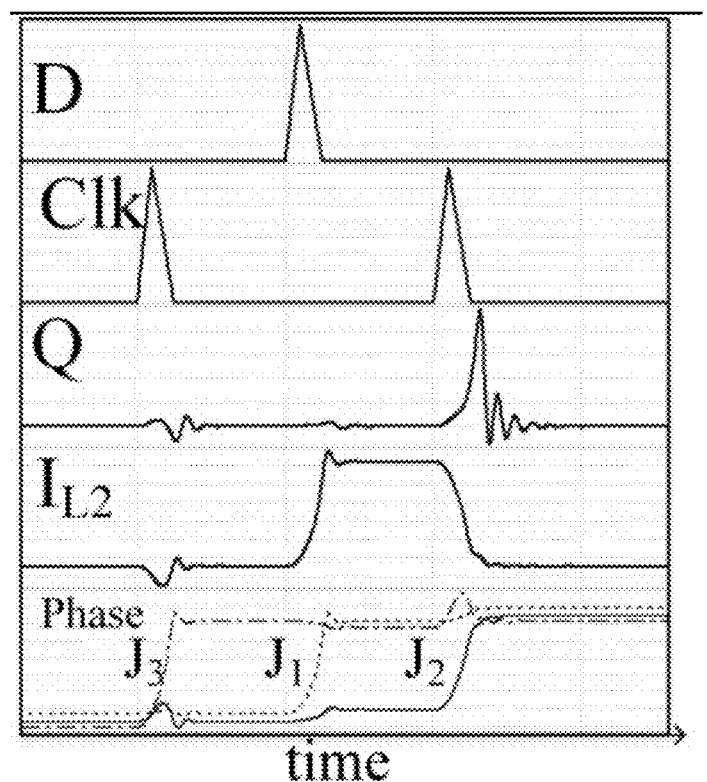

A key element of SFQ circuits is the Josephson Transmission line (JTL), which consists of several JJs that are DC-current biased with $I_b$ such that $I_b<I_c$. These JJs are connected in parallel to one another with series inductors in between, as shown in FIG. 7A. The inductance value L must be set to $L \approx \Phi_0/I_c$. Referring to FIG. 7A, an input pulse from input A triggers a $2\pi$-leap in J1; next the resulting pulse developed across J1 triggers a $2\pi$-leap in J2 through L2. The process repeats until the pulse is transferred to the end of JTL. To transfer a pulse from one location to two destinations, the SFQ pulse splitter is used (shown in FIG. 7B). Unlike CMOS, in SFQ logic, splitters must be used to fan out a source signal to different destinations.

DC SQUID (Superconducting Quantum Interference Device) with inductance L ($L^*I_c \approx 1.6^*\Phi_0$) is used as a memory element to conserve SFQ pulses. It is a quantizing SFQ loop [2], which is utilized in DFFs (J1-L2-J2 loop in FIG. 7C) and has two stable states: storing either zero (counterclockwise direction of is known as state "0") or one SFQ pulse (clockwise direction of is known as state "1"). The state of the loop depends on the input from D. The stored pulse in the loop can be read by using a clock (Clk) signal. Depending upon the state of the loop, the arrival of Clk pulse causes either J2 (if the state is "1") or J3 (if the state is "0") to leap. If J2 leaps, an output pulse will be generated, losing the SFQ pulse stored in the loop and resetting it to "0" state. If J3 leaps, no pulse will be generated.

Most SFQ logic cells are sequential in nature and contain both above operations described. Any SFQ logic gate can functionally be understood as an implicit coupling of asynchronous logic with a D-Flipflop. However, there are other logic families and techniques in SCE which are clock-less. Clock-to-Q delay of sequential gates (or clocked gates) and the delay of non-clocked gates such as JTL and splitter are in the range of 3 to 10 ps.

Additional details of the SuperFPGA and related method with experimental verification are set forth below and in "Superconducting Magnetic Field Programmable Gate Array," N. K. Katam, O. A. Mukhanov, and M. Pedram, IEEE Transactions on Applied Superconductivity, Vol. 28, No. 2, March 2018; the entire disclosure of which is hereby incorporated by reference.

I. SFQ FPGA Framework

There are several CMOS FPGA architectures commercially available in semiconductor industry from companies such as Xilinx [21] and Altera [22]. These companies have different FPGA architectures. However, all of these architectures contain CLBs to implement desired logic functions; programmable routing structure that connects all the CLBs according to the functionality of the implemented circuit on the FPGA; and I/O blocks to make off-chip connections to the CLBs through the routing network.

Based on the global arrangement of the routing structure, FPGA architectures can be classified as either island-style or hierarchical [16]. Our SFQ FPGA fabric is based on the island-style FPGA architecture where CLBs appear as islands in a sea of interconnects. In this architecture, CLBs are arranged in a two-dimensional (2-D) grid made by the routing network and it comprises of interconnects organized as horizontal and vertical routing channels (or tracks) with programmable switches to make connections among CLBs and from/to I/O blocks to/from CLBs. It should be appreciated that the invention concepts set forth herein apply to both island-style and hierarchical routing architectures. However, the specific examples set forth herein focus on developing all the FPGA sub-circuits and the fabric for the island-style architecture. The embodiments of the invention set forth herein use the following terminology for the three blocks that use programmable switches in the routing channels:

1) switch box;
2) horizontal connection block (HCB);
3) vertical connection block (VCB).

A. Overview of SFQ FPGA Implementation

SFQ FPGA cannot be directly derived or implemented based on its CMOS counterpart. None of the SFQ family technologies support the major benefits of the MOSFET switches and the bidirectional wires due to which the programmable routing becomes difficult, and thus, the implementation of SFQ FPGA also becomes difficult. SFQ connections are inherently unidirectional and a three-terminal switch like a MOSFET for an easy programming of routing channels is not yet available (in SFQ technology), though there is considerable work that is being done in that direction [23], [24]. Because of the unidirectional nature and the cost of routing network, (horizontal) data flow is only in one direction, from left to right in our implementation of SFQ FPGA. However, two separate lines are employed vertically, up (bottom to top) and down (top to bottom) for a bidirectional data flow. Due to the timing requirements of clocking in gate-level pipelining, routing of signals with data flow in both directions for horizontal tracks can become very difficult and will be expensive in terms of area and delay. Hence, bidirectional tracks are not implemented in the horizontal direction. Thus, the input ports are located on the left side of the FPGA block, the output ports are located on the right side of the block, and both input and output ports are on the top and the bottom sides of the block.

Because of the reasons mentioned above, CMOS FPGA configurations of the switch box and the connection blocks cannot be directly used for implementing the programmable routing in SFQ FPGA. We have modified the Wilton switch box topology [25] in a way that is SFQ specific and scalable for a larger number of routing channels. Our designs of horizontal and VCBs serve dedicated functions in terms of routing and interconnections. These programmable routing blocks contain MJJs that are used as bias limiting junctions in ERSFQ biasing to control the bias current delivered to the circuit components in the implementation of a programmable switch. This leads to a more compact design in contrast to the earlier implementations of a switch based on the use of NDRO cells, which consumes a larger area (for programmable switches) compared to the other resources required for FPGA implementation. In the rest of the paper, unless it is mentioned otherwise, all the logical cells are to be assumed clocked cells and the operation of the circuit (or FPGA) is to be assumed synchronous operation.

II. Design and Details of SFQ FPGA Fabric

A. NDRO-Based CLB

Figure 8A:
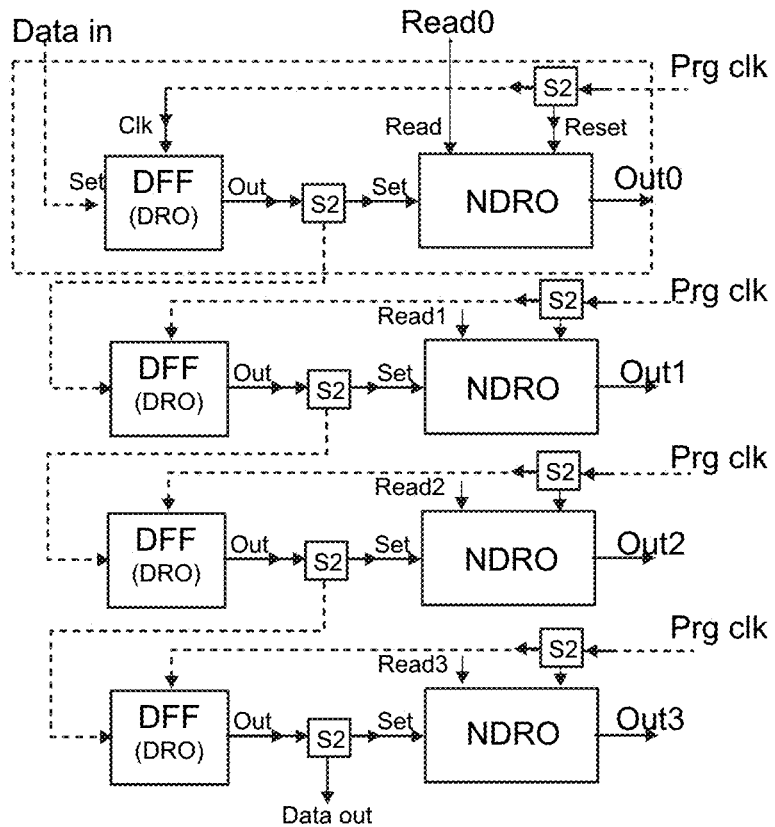
FIGS. 8A, 8B, and 8C. (A) PS block implementation with NDROs and DFFs. A PS unit is shown in a dashed red rectangle and a PS block is formed by serially connecting PS units. S2 represents 1-to-2 splitter. Functional waveforms in Verilog hardware description language (HDL) simulation: (B) Signals during programming mode: Writing 0 1 0 1 (for PS units at positions 0 1 2 3). (C) Signals during reading mode. PS units at positions 0 and 2 do not produce output pulse for the respective Read input. PS: Program and Store.
Figure 8B:
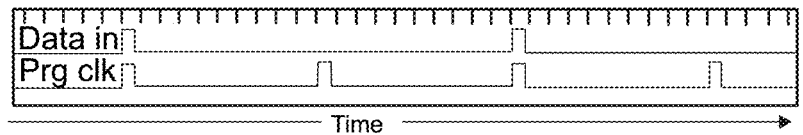
Figure 8C:
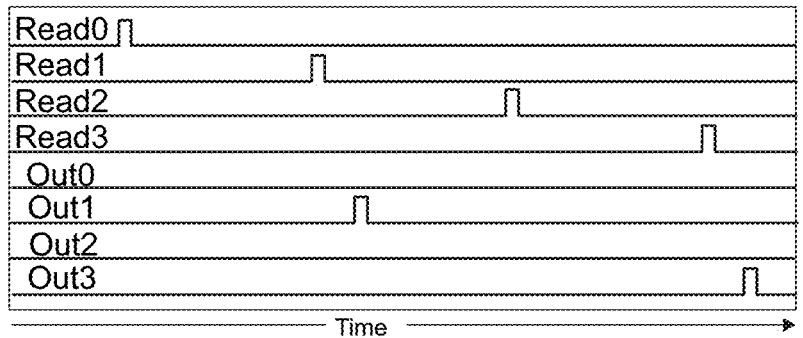

1) Program and Store Block:

Many commercially available CMOS FPGAs use static memory (SRAM) cells for programming and storing the LUTs of desired gates in CLBs of FPGA fabric. Program and Store block is one of the building blocks in our NDRO-based CLB implementation with the capability of programming and storing the data to configure a CLB into the desired gate, and its usage is explained in the following subsections. For SFQ technologies, SRAMs can be replaced by NDRO cells, though we cannot program and use these cells in the same way as SRAM cells. We propose a scan chain structure for NDROs as illustrated in FIG. 8A to program them serially. The scan chain structure is used because of its built-in support for bit-serial programming. Parallel loading of the data-to-be-programmed into the storage elements (NDROs) is not possible due to the limitation of I/O pins count. Hence, a scan chain structure is used to load data serially into all the NDROs of the circuit. Scan chain mechanism is popular in the testing of CMOS circuits.

A scan chain is formed by serially connecting multiple program and store (PS) units. A single unit is shown with a dashed rectangle in FIG. 8A. Data is serially given at the input data in, one input per a programming clock pulse, Prg clk. Each PS unit has a Prg clk input and the programming clock pulse can either reach all units (in a block) at the same time or consecutively beginning from the first cell to which the data are serially given at input, data in to be stored in the block. In the case of programming clock pulse not arriving at all PS units at the same time, the time difference between its arrival at two consecutive cells cannot be more than the time period with which data are given serially as input at data in. With the input data arrival, input (either 1 or 0) is stored in a PS unit's D-flipflop (DFF). Each (input) pulse at Prg clk first resets the respective PS unit's NDRO and then clocks the DFF to release the data value stored in it. Then, it gets subsequently stored in the NDRO along with passing the same data to the next PS unit to receive with the next Prg clk input (if present). So, the serial input data given at data in keeps moving down by one PS unit with every programming clock pulse.

The scan chain as shown in FIG. 8A can be programmed with four Prg clk pulses with the bottom-most PS unit's input going as the first input to Data in and the top most PS unit's input going at the end. The stored values can be read with the arrival of respective PS unit's Read input. Hence, this PS block has two modes: programming mode and reading mode. Data out pin of a PS block will be connected to Data in pin of the next PS block in the FPGA fabric implying that all PS blocks in the fabric are serially connected (making a large PS block). Hence, all PS units in the fabric can be programmed with presenting the data-to-be-programmed at the first PS unit's data in pin in a serial bit stream. Programming clock pulses need to be given to all PS units along with the input bit stream whose number should be equal to the number of PS units in the fabric with the same frequency of input bit stream. Programming new data into a PS block will automatically erase the old data stored in it. Using this PS block, we have designed two CLBs that are presented in the following subsections. These two types of CLBs will be modified by replacing NDRO-based PS block with magnetic switches and will be presented in a later section.

Figure 9:
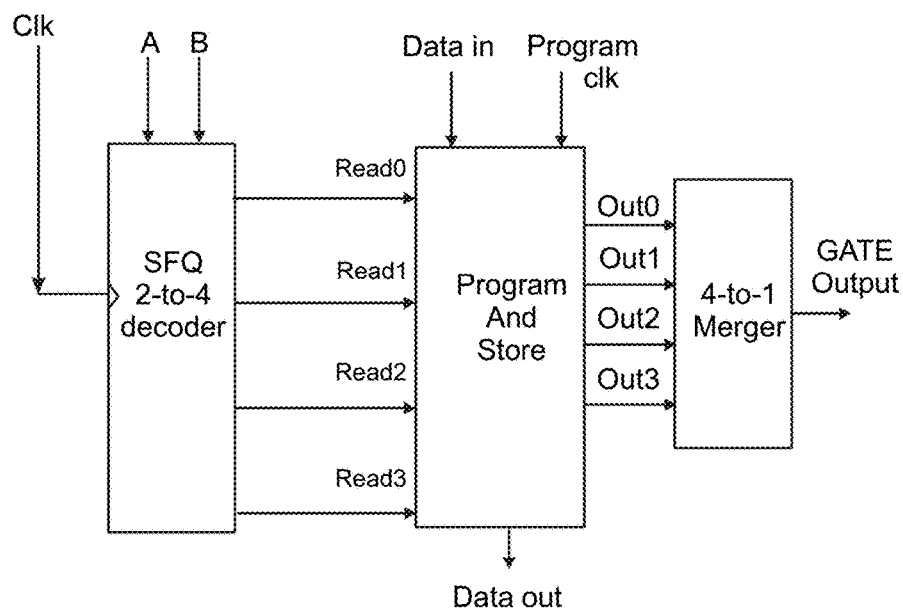
FIG. 9. Implementation of the LUT-based CLB for a two-input gate using a decoder with DFFCs, PS block with NDRO-based switches and a 4-to-1 merger. DFFC: D-Flip-flop with complementary outputs.
Figure 15:
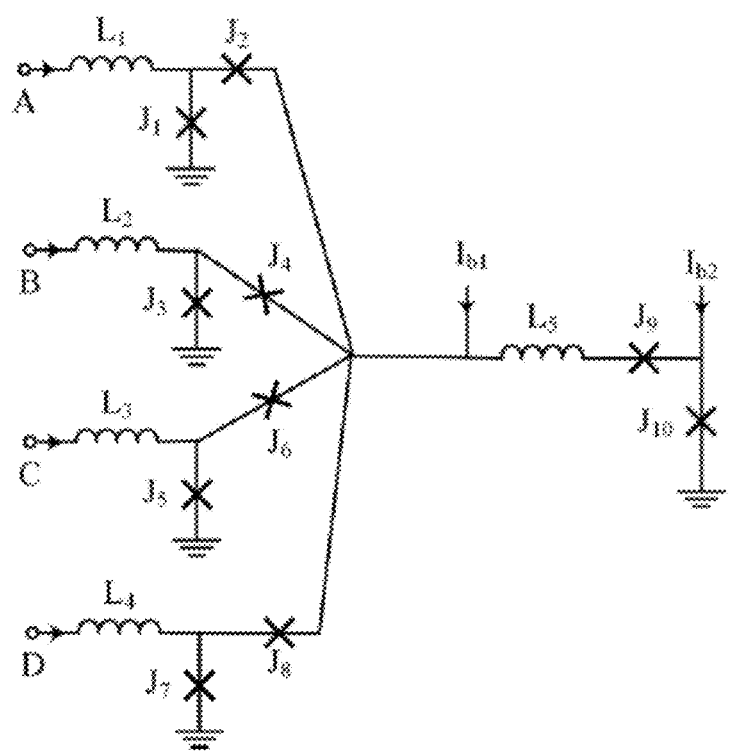
FIG. 15. Merger circuit used in implementing LUT-based and FS-based CLBs.

2) LUT-Based CLB:

FIG. 9 shows our implementation of the LUT-based CLB unit for a two-input gate. A four-PS unit block as shown in FIG. 8A is used to store four different output values for all four combinations of the two inputs of any two-input gate. Initially, PS block in a CLB has to be programmed with the truth table of the gate to be implemented, in the programming mode. The truth table stored in a PS block will be held in it until it is in programming mode again, i.e., the arrival of the next programming clock pulse for a PS block. Once the programming of PS block is finished, it will be operated in the reading mode. The circuitry to the left of PS block is the implementation of an SFQ decoder that gives out only one of the Read signals (of a total of four) based on the inputs to the CLB. The Read signal then reads the proper value stored in the PS block to give out the output of CLB. A 4-to-1 merger (FIG. 15) is used at the end to merge all four outputs of the PS block to collect the output signal at one node. Merger produces an output pulse for an incoming pulse at any of its inputs. Since only one output can come out of PS block per clock cycle, no two signals would ever be merged, but only one of the four out signals will be presented at the CLB output.

Figure 10:
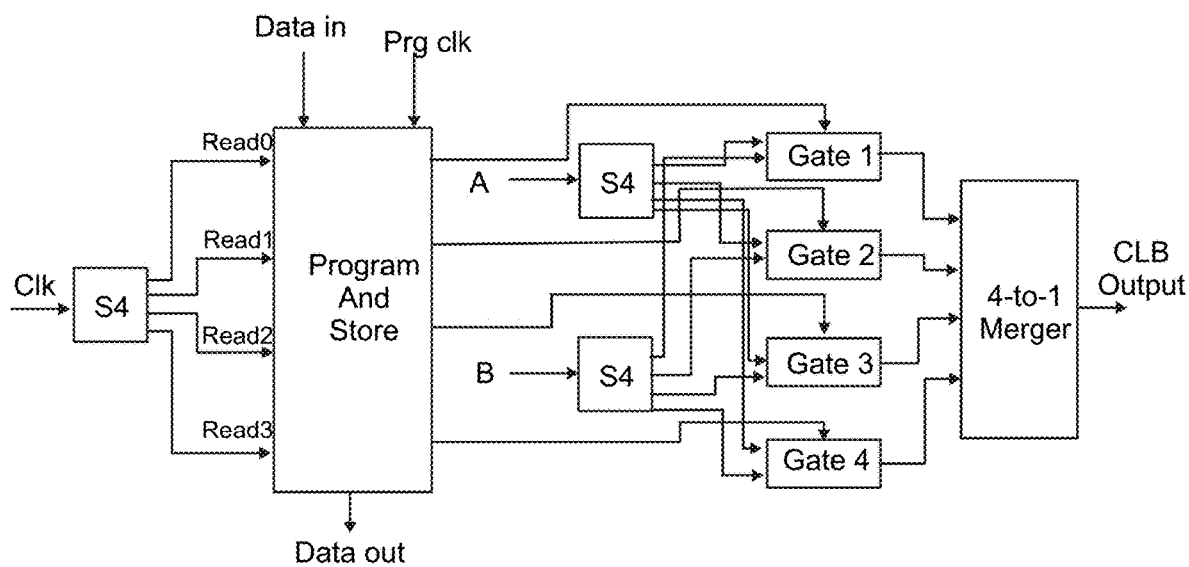
FIG. 10. Implementation of the FS-based CLB for four two-input SFQ gates using a PS block with NDRO-based switches, an actual implementation of gates and a 4-to-1 merger.

3) Function Selection (FS) Based CLB:

FS-based CLB consists of an actual implementation of logic gates instead of LUTs. In the case of CMOS, this kind of CLB implementation is undesirable. However, the comparable cost of implementation and the relatively small size of an SFQ cell library makes this implementation equally desirable for SFQ. FIG. 10 shows a (single-PS block) CLB implemented with four two-input gates. One or more of them can be one-input gates (e.g., inverter or D-flipflop). Each NDRO output of the PS block clocks one of the four gates in the CLB and it is programmed such that the only gate in the CLB that is to be implemented will have the respective NDRO set. Inputs A and B reach all four gates, but only the gate being implemented will be clocked, and hence only one of the gate's result will be received at the CLB output. Since the inputs A and B reach all four gates in the CLB but only the implemented gate is clocked, the other three gates are not reset, implying that these gates must be reset if these are to be used later. To reset the CLB, all NDROs in the PS block are to be set, and consequently, CLB is to be clocked once. To avoid this resetting before reprogramming, a triple-PS block CLB can be used with two additional PS blocks that select the gate toward which input A and B should be delivered. However, this will increase the cost of implementation by twofold. Note that the CLB needs to be reset only when the whole FPGA fabric is being reprogrammed for the implementation of a different circuit. Note that the FS-based CLB can implement non-combinational gates such as C-Muller element [19].

B. Programmable Routing

1) Programmable Switch Implementation: Our approach is based on the ability to program the value of critical current ($I_c$) of an MJJ by manipulating the magnetization of its ferromagnetic layers using a magnetic field or eventual spin-torque transfer. The MJJ is used in place of a dc bias limiting junction in ERSFQ biasing. This allows the use of a single MJJ instead of bulky SQUID and SFQ gates (e.g., NDRO) to perform FPGA programming. Please note that the typical size of the MJJ is comparatively much smaller than the size of a typical SQUID or an SFQ gate. In principle, any type of MJJ exhibiting modulation of critical current [26]-[32] can be used for the programmable bias current limiting junction. However, we consider a superconductor-insulator-superconductor-ferromagnet-superconductor (SIsFS)-type MJJ [29]-[31] as preferable for several reasons:

1) simpler and higher yield fabrication due to a simpler structure with a single ferromagnetic layer and somewhat larger dimensions (2 μm×2 μm);

2) an acceptable bias current flowing through the MJJ providing the necessary reference self-field;

3) higher $I_c R_n$ compatible to that of regular JJs used in SFQ circuits.

The SFT-based MJJ [32] due to its high $I_c R_n$ would also work as a programmable current limiting junction in ERSFQ biasing for implementing switches.

Figure 2A:
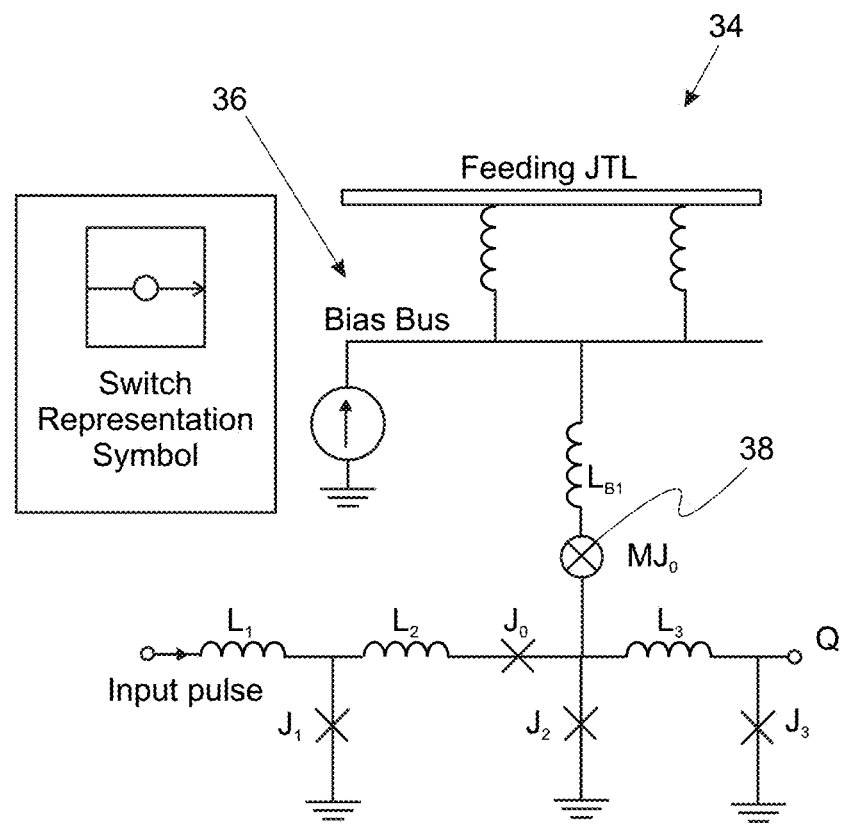
FIGS. 2A and 2B. Switch implementation with MJJ as the limiting junction in ERSFQ biasing. (A) Circuit schematic and representational symbol for MJJ-based switch. $I_{c0}$=100 A; $I_{c1}$=$I_{c2}$=$I_{c3}$=200 µA; $L_1$=$L_2$=$L_3$=4 pH. (B) Circuit simulation: result of switch output Q when $I_c$ of $MJ_0$ is 150 µA and 250 µA showing the blocking and the passage of input pulse, respectively.
Figure 2B:
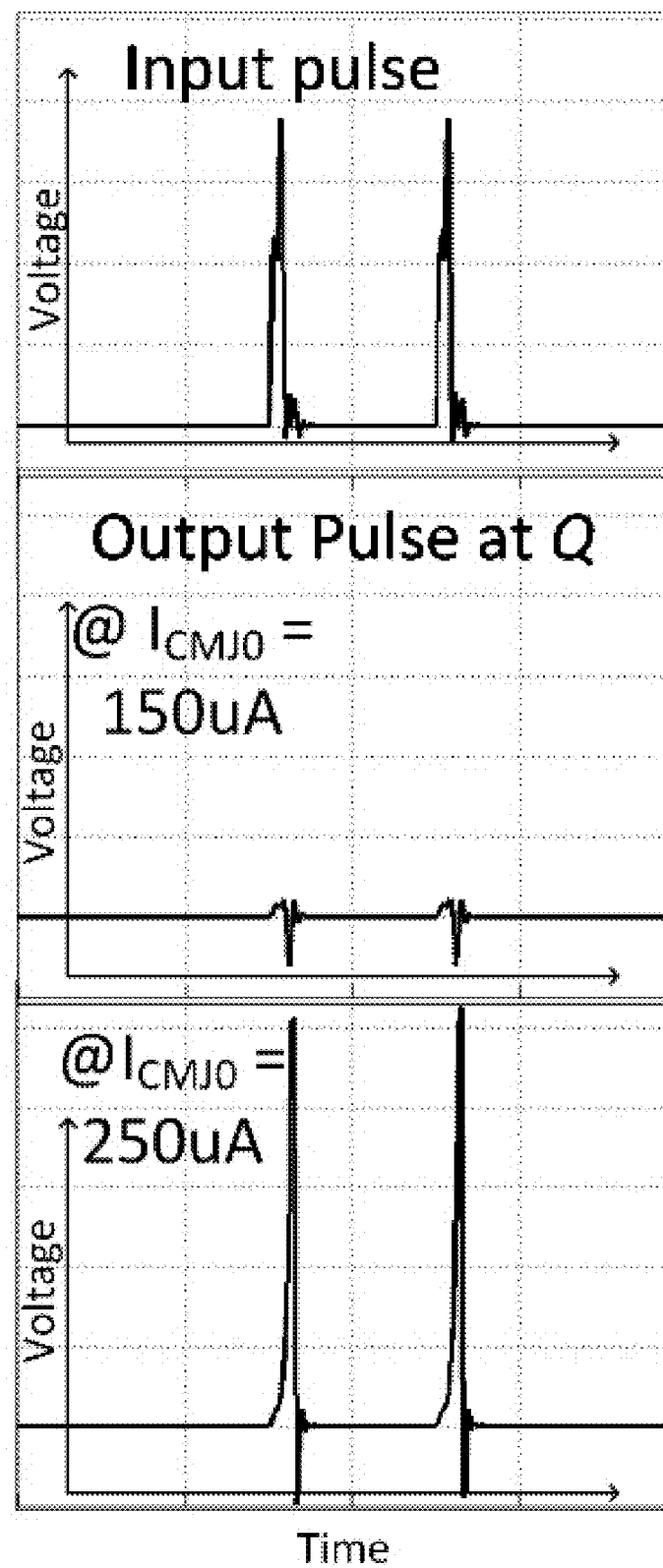

FIG. 2A shows the implementation of a programmable switch with an MJJ used in ERSFQ biasing. Simulations [see FIG. 2B] show that the incoming SFQ pulse would pass from input to Q only when the $I_c$ of MJJ bias junction ($MJ_0$) is 250 μA (high). When the $I_c$ is 150 μA (low), the pulse would not pass because of the insufficient bias current delivered to make $J_2$ switch (undergo a $2\pi$ phase slip) upon the arrival of an incoming pulse. In this case, $J_0$ switches. As one can see, the programmable switch is implemented using a very simple, robust, and compact circuit, which is essentially a variant of a Josephson transmission line (JTL) stage.

Figure 11:
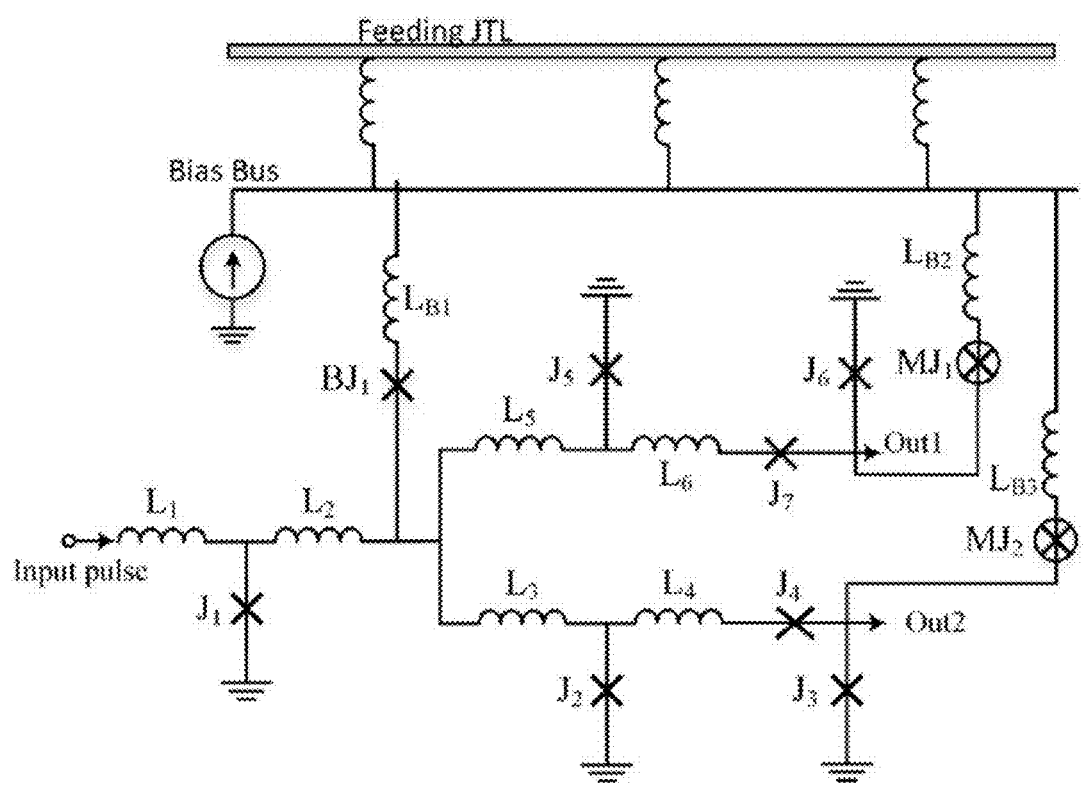
FIG. 11. Circuit implementation of a two-way splitter with MJJ-based switches used in FPGA subcircuits. BJ refers to a regular JJ that is used as bias limiting junction in ERSFQ biasing that does not require programming. MJ refers to a magnetic JJ that will be used in switch implementation with programmable $I_c$.

Switch Box:

In a general CMOS FPGA, a fixed and same number of metal tracks run horizontally and vertically, organized in channels. A programmable switch box is placed at each intersection of horizontal and vertical routing channels. In our FPGA fabric implementation, because of the proposed unidirectional data flow in the horizontal direction, we use two (can be more) horizontal tracks going from left to right and four vertical tracks: two each running in up and down directions. We have modified the Wilton switch box topology for our switch box implementation to fit the unidirectional data flow in the horizontal direction and due to the relative difference in the number of tracks between horizontal and vertical channels. It is presented in FIG. 5A and it comprises of splitters combined with aforementioned programmable switch implementation and mergers. A 1-to-3 splitter is used for a signal coming from the left in order to transfer the signal from the left to either the top, right, or bottom. MJJ-based switches attached to the splitter outputs control the direction in which the signal is being transferred. Similarly, 1-to-2 splitter with switches is used for a signal coming from either top or bottom. Bias MJJs of switches attached to these splitters will be programmed in such a way that the signals are routed according to the circuit being implemented on the FPGA. FIG. 11 7 shows the schematic of FIG. 5E, which is represented as a dotted rectangle in switch box architecture of FIG. 5A. A 3-to-1 merger (2-to-1 mergers) is used to merge signals coming from the rest of the three (two) directions on the right side (top and bottom). Note that the programming of MJJ-based switches, which is based on the routing of signals, will ensure that no more than one input signal will be active for any merger.

Figures 12A, 12B:
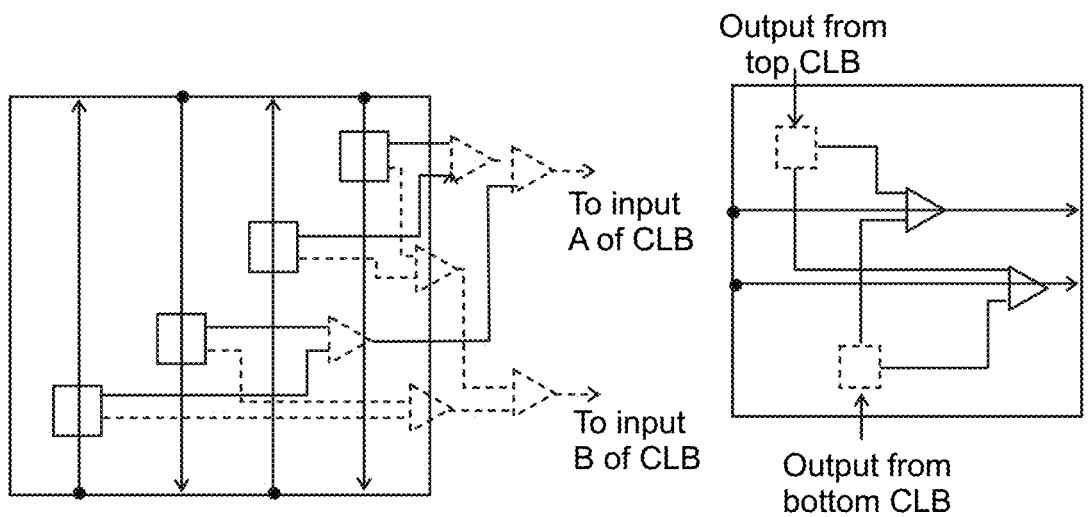
FIGS. 12A and 12B. Connection blocks (CB). (A) Vertical CB. (B) Horizontal CB.

Connection Blocks: In our SFQ FPGA implementation, the HCB, and the VCB connect the CLBs with the routing channels and are part of programmable routing. We have separate and dedicated for HCB and VCB. Inputs are taken from the routing network to the CLBs through vertical CBs and the output of CLBs is taken to the routing network through horizontal CBs. Their implementation can be seen in FIG. 12. In VCB, a signal from each vertical channel is split (with a switch at the output to control its destination) and one split output from each vertical channel is merged to be given as input to one of the CLB inputs. Similarly, an output from CLBs is split (with switches to control their destination) and then merged into each of the horizontal channels.

C. Magnetic CLB

In Section III-A, two kinds of CLBs are explained with details. However, the implementation of CLBs is done through the use of NDROs that consume a significantly large area and require extra steps for programming. We have presented these NDRO-based CLBs earlier in order to explain our prior work and also to illustrate the advantages and savings that come with the usage of MJJ-based switches For an LUT-based CLB with magnetic switches (MJJ-based switches), the PS block in the CLB (see FIG. 9) can be replaced with four instances of MJJ switch [shown in FIG. 2A], each of which either transfers or blocks the signal from each of the four Read locations to respective out locations [see FIG. 4A]. These four MJJs will be programmed to have critical currents in a way to reflect the truth table of the gate to be implemented. For example, in the case of AND gate implementation, MJJs in top three switches will be programmed to have a low critical current (150 μA) and the MJJ of the last switch will be programmed to have a high critical current (250 μA). Because of this programming, only in the case of arrival of both of the inputs, the decoded signal will pass through the switch producing a pulse at the CLB output.

For an FS-based CLB with magnetic switches (MJJ-based switches), the PS block in FIG. 10 will be replaced by a 1-to-4 splitter with switches attached to the splitter outputs similar to the ones shown in FIGS. 5D and 5E. Only one out of four MJJs belonging to four splitter outputs [S4sw block shown in FIG. 4C] will be programmed to have a high critical current and this splitter output will be clocking the gate-to-be-used out of the four gates in the FS-based CLB. Due to this programming of MJJs, though the input reaches all the gates, only one of the gates will be clocked, subsequently producing the output (depending on the internal state of that particular gate based on the inputs). After the replacement of NDRO-based switches with MJJ-based switches, we will call triple-PS block and single-PS block CLBs as triple-switch block and single-switch block CLBs, respectively. Comparison of the JJ count between NDRO-based CLBs and MJJ-based CLBs is shown in Table I. Note that the bias JJs refer to the regular JJs that are used in the ERSFQ biasing scheme (e.g., BJ1 in FIG. 11) and MJJs replace these regular biasing JJs whenever programming is required (e.g., MJ1 in FIG. 11).

TABLE I

Estimates of JJ count

| CLB type | Switch type | JJ Count Logic | Bias | MJJ count |
|---|---|---|---|---|
| LUT | NDRO | 137 | 33 | 0 |
| LUT | MJJ | 64 | 14 | 4 |
| FS, single-PS | NDRO | 156 | 38 | 0 |
| FS, single-switch | MJJ | 86 | 17 | 4 |
| FS, triple-PS | NDRO | 316 | 78 | 0 |
| FS, triple-switch | MJJ | 106 | 17 | 12 |

(RT) controller, one can send the MJJ address and the signal (1/0) for programming (N address bits+a programming bit to set the MJJ to either high or low $I_c$ value). These bits can be sent in parallel through N+1 lines or in series via a single line to the on-chip serial to parallel converter. The serial operation would take longer but requires the minimum number of lines. In general, the programming speed is not a priority. This approach is also readily scalable, as the on-chip programming is done by the minimalistic MJJ crossbar wiring and the RT connection is minimized by on-chip periphery decoders and serial to parallel converters. Typical programming time for the MJJ is from 100 ps to 1 ns and it depends on the programming current value (currents through VAL and HAL). Since MJJs are typically fabricated using separate process steps compared to conventional SFQ JJs, the whole FPGA programming layer including the power plane, programmable MJJs, and ALs can be implemented separately from the FPGA logic and later be connected with the rest of the SFQ circuit implementation. As a result of this vertical integration, the area overhead of the programming layer will be minimized. A brief summary of the comparison between NDRO-based switches and MJJ-based switches is presented in Table II.

TABLE II

NDRO-Based Switches Versus MJJ-Based Switches

| Switch type | NDRO-based | MJJ-based |
|---|---|---|
| Active devices | Regular JJs | Regular and magnetic JJs |
| Implementation | Bulky SFQ cells (e.g. NDRO) | Part of biasing and LO JTL, no additional cells |
| Area comparison | Larger | Smaller |
| Delay comparison | Larger | Smaller |
| Power comparison | Larger | Smaller |
| Programming method | Serial programming of NRDOs in a scan chain structure | Magnetic coupling MJJs with current lines in a crossbar structure |
| Additional circuitry for programming | Consumes a larger regular JJ chip space | Most of it is implemented o a separate layer |
| Fabrication process | Single-layer SIS JJ process | Bos SIS and MJJ processes, preferably a double JJ-layer process |

D. Switch Programming

Figure 3A:
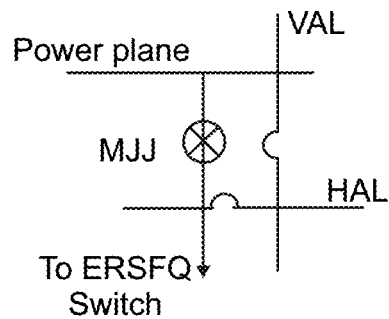
FIGS. 3A, 3B, and 3C. Programming layer for MJJs on chip with current lines also refereed as access lines (ALs). (A) Programming unit of MJJ. HAL: Horizontal AL; VAL: vertical AL. (B) MJJs are located near the intersections of crossbar made by HALs and VALs used for programming MJJs. (C) Using external decoders to access specific MJJs out of all MJJs belonging to the FPGA fabric.
Figure 3B:
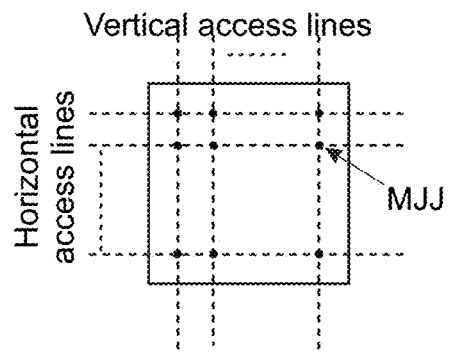
Figure 3C:
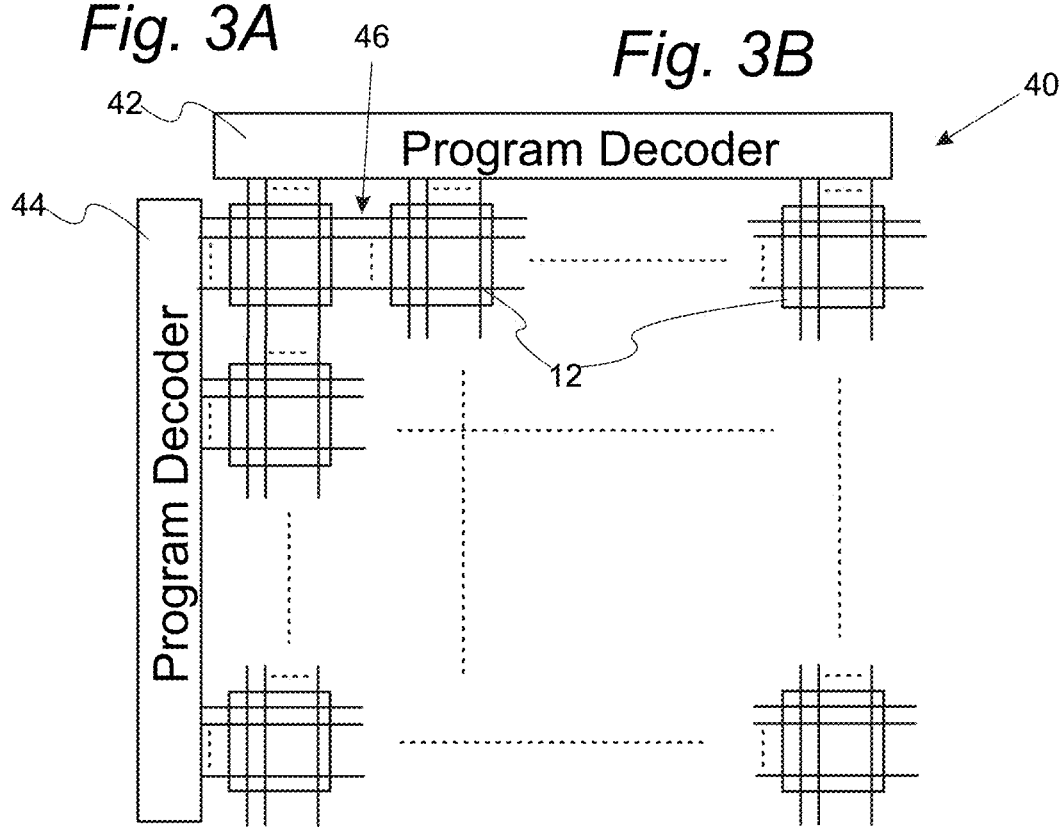

FIG. 3 describes our approach to implement the FPGA programming by setting MJJ-based ERSFQ switch biasing into high or low $I_c$ values. The MJJ limits dc bias current delivered to the corresponding switch from a common power plane depending on the value of its $I_c$. The $I_c$ can be programmed by applying currents via vertical (VAL) and horizontal (HAL) access lines (ALs) that are magnetically coupled to each MJJ at their intersection in the crossbar structure [33] made by ALs [see FIG. 3A]. According to our estimate, each FPGA mosaic unit may require a maximum of 42 MJJs for a two-input CLB (maximum MJJs are required for a mosaic with two-input triple-switch FS-based CLBs). One can arrange the programming FPGA layer as a matrix of blocks with 7×7 ALs shown in FIG. 3B. Programming decoders can set the programming currents for each MJJ as shown in FIG. 3C. These decoders can be SFQ-based (e.g. [34], [35]) and located on the periphery of the FPGA fabric.

HAL and VAL are connected to program decoders through output current drivers. From a room temperature E. SFQ FPGA Operation SFQ circuits (especially, RSFQ which is widely implemented) are operated in two well-known ways: synchronous and asynchronous wave-pipelining (AWP). Synchronous operation: each logic cell in the circuit requires a clock pulse for the operation and there is a minimum clock period determined by the implemented circuit for the proper operation of the circuit. Several ways of distributing the clock pulse to every cell in a circuit are described in [36]. An SFQ FPGA fabric containing either LUT-based or FS-based CLBs support the synchronous operation of FPGA. After the programming of all switches in an FPGA fabric, a CLB will be representing a specific gate in the implemented circuit and only a single clock is required per operation of that gate. A straightforward way of clock distribution to CLBs for synchronous operation is to use splitters and JTLs to form an H-tree, resulting in the zero-skew clocking scheme.

Figure 13:
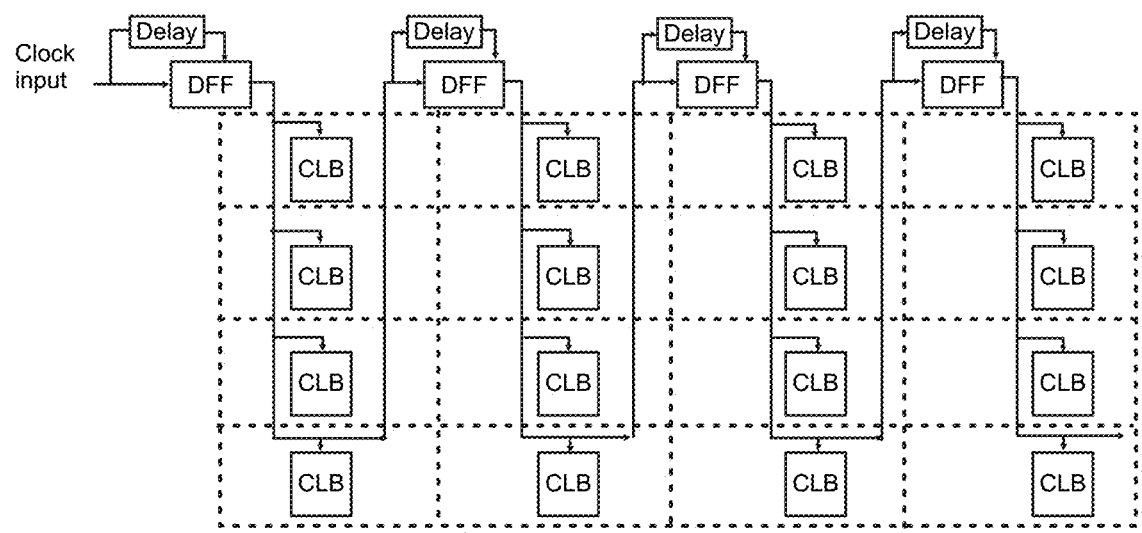
FIG. 13. Clock pulse distribution to synchronous CLBs in SFQ FPGA.

Here, we present another way of clock distribution to the CLBs, which is a variant of the clock-follow-data [36] clocking scheme and is shown in FIG. 13. A self-clocked DFF cell is made by feeding its data-input to its clock-input through a delay. The output of this self-clocked DFF cell is fed to clock inputs of all CLBs in a column. The clock-input of the last CLB in the column is fed to a self-clocked DFF cell, which will again distribute the clock to CLBs in the next column. Multiple self-clocked DFF cells can be used to distribute the clock to CLBs of separate sections of a column, based on the total number of CLBs in a column. The delay element used in the self-clocked DFF cells can be engineered according to the actual implementation of FPGA fabric so that the circuit operation matches the delays of routed signals between CLBs.

The clock-follow-data scheme requires all cells of level i to be clocked and the input data to be prepared for the next level before clocking any cell of level i+1 [37]. To implement this scheme, CLB columns are to be partitioned into groups designated for cells belonging to a specific level. For example, column 1 belongs to level 1 cells and column n belongs to level n cells. However, the number of cells belonging to a level of a circuit can be larger than the number of CLBs in a column of FPGA fabric. In such a case, a minimum consecutive group of columns that are enough to implement the number of cells of a level will be assigned to that level. Hence, consecutive groups of columns from left to right will represent consecutive levels in a circuit beginning from level 1 to the maximum level of that circuit. In the case of cells belonging to a level taking up more than a column of CLBs, clock distribution between those columns need not be done through the self-clocked DFF but will be bypassed with a connection between them using an MJJ-based switch.

III. SFQ FPGA Fabric Extensions

Two possible extensions of the above presented SFQ FPGA are to utilize the fabric for AWP and to modify the fabric for gates with more than two inputs (multiple-input) or for more than four gates.

A. SFQ FPGA for AWP

In AWP, some of the logical cells in the circuit do not require a clock signal to operate and signals travel through the circuit asynchronously [7] with additional timing requirements. However, a ready pulse that follows the data is used to reset/clock some of the cells after a small period of time to make them ready for the next set of input signals/to evaluate the current state of the cell. Since some gates produce the output without the requirement of clock signal and just with the arrival of in-put signals, only FS-based CLBs implemented with the desired combination of asynchronous and clocked cells can be used for the AWP operation of FPGA. A comparison of FS-based and LUT-based CLBs is provided in Table III. FS-based CLB (for asynchronous operation of FPGA) is shown in FIG. 4B. In this case, splitters distributing inputs to the gates and the splitter distributing clock to the gates will have switches at their outputs (triple-switch block CLB) and they will be programmed accordingly. Note that all inputs including clock are directed toward the gate that is to be implemented in the CLB by programming the MJJ-based switches in S4sw block. A reset/clock signal as per the requirement of a cell in the implemented circuit can be distributed with the same mechanism as described in Section III-E for the AWP operation. Zero-skew clocking with H-tree implementation cannot be used for an AWP operation.

TABLE III

| CLB | FS-based | LUT-based |
|---|---|---|
| Can implement clocked gates | Yes | Yes |
| Can implement non-clocked gates | Yes | No |
| Synchronous operation of FPGA | Yes | Yes |
| AWP | Yes | No |
| Any SFQ gate can be implemented | Yes | No |
| Smaller area (JJ count) | No | Yes |

B. SFQ FPGA with Multiple-Input Gates

SFQ fabric presented in the sections above has CLBs implementing two-input gates and a routing network that can route signals only for a circuit implemented with two-input gates. This fabric can be extended for multiple-input gates by modifying the CLBs to handle gates with more than two inputs and by increasing the number of routing tracks accordingly. An LUT-based CLB can be modified as follows.

1) Implement a decoder that can decode the maximum number of inputs that a gate can have in the desired CLB implementation.
2) Attach an MJJ-based switch at every decoder output.
3) Build a merge-block that can merge all of these switch outputs to give the CLB output.

An FS-based CLB can be modified as follows.

1) Implement the desired gates for the CLB and implement splitters (with switches) for carrying the inputs (and clock) to all the eligible gates.
2) Implement a merger circuit to merge outputs of all the gates in the CLB.

The routing network also must be modified according to the number of inputs. The number of horizontal tracks and the number of vertical tracks both in up and down directions should at least be increased to the maximum number of inputs that a gate can have in the desired CLB implementation. Consequently, switch box and connection blocks should be upgraded to handle an increased number of tracks and the inputs to the CLB. An estimation of JJ count for the larger size CLBs (for synchronous operation) is given in Table IV. JJ count estimation is based on the following observations: LUT-based CLB with n inputs should implement LUT with $2^n$ entries (thus, an n-to-$2^n$ decoder with $2^n$ MJJ switches) and use a merger of size $2^n$-to-1. FS-based CLB with n gates should implement gates with $\log_2 n$ inputs, $\log_2 n$ number of 1-to-n splitters with one splitter having MJJ switches at the output, and a merger of size n-to-1. For FS-based CLBs, JJ count can be smaller than the number given in the table, considering the fact that not all gates will have $\log_2 n$ inputs out of total n gates.

TABLE IV

Estimates of JJ count

| CLB type | JJ count | | MJJ count |
|---|---|---|---|
| | Logic | Bias | |
| LUT based with 2-inputs | 64 | 14 | 4 |
| LUT based with 3-inputs | 152 | 35 | 8 |
| LUT based with 4-inputs | 322 | 76 | 16 |
| FS based with 4 gates | 86 | 17 | 4 |
| FS based with 8 gates | 190 | 35 | 8 |
| FS based with 16 gates | 422 | 72 | 16 |

IV. Results

All the proposed circuit elements are designed and simulated in WRSpice circuit simulator with ERSFQ biasing. All circuit JJs have a $\beta_c$ value of 1. For the sake of simulations, the typical high and low $I_c$ values of MJJs are chosen based on the switch circuit implementation. They are changed manually to have either low (150 µA) or high value (250 µA) in the circuit simulator due to the lack of simulation models. Verilog models have also been developed for all the FPGA subcircuits such as CLB, PS block, switch Box, HCB, and VCB for simulating the complete FPGA circuit. Circuit blocks related to the fabric extensions presented in Section IV are also modeled in Verilog. All simulations have given us the expected results and verified the operation of FPGA.

A. Implementation Estimations

Table V shows the number of JJs required for each sub circuit in SFQ FPGA and for an FPGA mosaic consisting of a CLB, a switch box, an HCB, and a VCB. An FPGA fabric will be made of several copies of this mosaic arranged symmetrically in an array. A few JTLs might be needed for interconnection that are not accounted for in the junction count. However, the area estimations given in the table account for any extra JTLs required to layout the circuit of mosaic properly. For the implementation of a four-row and four-column FPGA fabric with FS-based CLBs, we have an estimated maximum operating frequency of 15 GHz for synchronous operation. This frequency is calculated based on the time period required for a CLB to output its result on a horizontal routing channel, transfer through the switch box, routing channels, and then through VCB to go as an input to a CLB in the next column.

TABLE V

JJ Count and Area Estimation of FPGA Subcircuits

| FPGA Sub-circuit | JJ count | | MJJ count | Area estimation (µm$^2$) |
| --- | --- | --- | --- | --- |
| | Logic | Bias | | |
| HCB | 28 | 8 | 4 | 14 400 |
| VCB | 70 | 22 | 12 | 33 600 |
| Switch Box | 82 | 26 | 14 | 48 400 |
| CLB | 106 | 17 | 12 | 56 200 |
| Total mosaic | 286 | 73 | 42 | 1 52 600 |

B. Circuit Implementation Example on FPGA Fabric

Figure 14A:
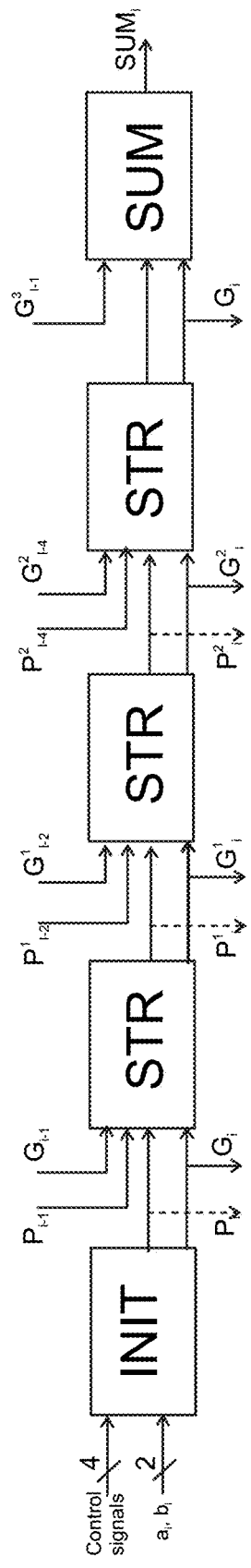
FIGS. 14A and 14B. FPGA implementation example: (A) Circuit block of 8-bit ALU that contains all building blocks and the signal path from the inputs to the output of an asynchronous wave-pipelined ALU in [7]. (B) Synthesized (with all clocked cells), placed, and routed ALU block on our proposed SFQ FPGA. FPGA fabric grid is shown with dotted lines.

An 8-b asynchronous wave-pipelined ALU is demonstrated in [7]. We have synthesized the building blocks of this ALU with all clocked cells so that it can be implemented on the designed FPGA fabric with the synchronous operation. To assess the efficiency of our FPGA approach, we implemented a circuit containing all the building blocks of the ALU as shown in FIG. 14A. In FIG. 14, we have shown the implementation (synthesis, placement, and routing on FPGA fabric) of a part of the ALU circuit containing all building blocks and the data path representing signal flow from the inputs to the output (refer to FIGS. 1 and 2 in [7]). Logic synthesis of the circuit, placement on FPGA fabric, and routing through the routing network is done manually.

Figure 14B:
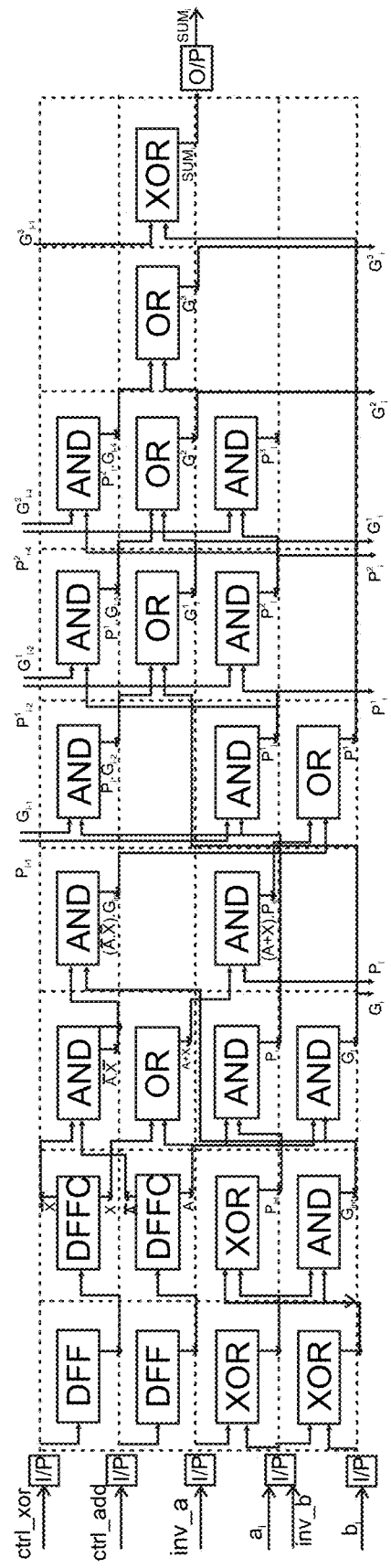

FIG. 14B shows the implementation of the ALU block with a clock-follow-data clocking scheme (presented in Section III-E) without the buffer DFFs for the signal paths that travel to any higher level other than the next level [37]. This implementation without buffer DFFs might require FPGA to be operated at a lower frequency so that the timing violations would not occur. It can be implemented on a 4×9 CLB array of SFQ FPGA fabric with synchronous FS-based CLBs containing these four gates: D-flipflop with complementary outputs, AND gate, OR gate, and XOR gate. Only 11 out of 36 CLBs are not used, resulting in a utilization of 69.5% of total CLBs. For the maximum frequency of operation (or for clock distribution using H-tree), buffer DFFs must be inserted for signal paths with signals traveling more than one level. For this implementation, an FPGA fabric of 5×9 CLB array is required and it will have a utilization of 71% of total CLBs. Note that the implementation of a complete ALU circuit can result in a lower utilization of CLBs since there will be more signals to route across different ALU blocks similar to the block shown in FIG. 14A.

C. Discussion

Some Discussion Points to Consider are as Follows.

1) We do not expect to use any passive transmission lines in the implementation of SFQ FPGA fabric with our layout estimations showing that all subcircuits can be laid out side by side and can be connected to each other with JTLs (if needed). No use of PTL helps in decreasing the delay.

2) Similar to the vertical routing channels, two horizontal routing channels can also be run in both directions, left to right and right to left. The tradeoff between implementation cost and routing advantage of bidirectional horizontal tracks guided us toward unidirectional horizontal tracks. However, in implementing circuits such as a complete 8-b ALU with a few strategically placed bidirectional horizontal tracks can help in increasing the utilization percentage of CLBs.

3) CAD tools and the algorithms for logic synthesis of a circuit for CLB specific SFQ FPGA fabrics, placement of synthesized gates on the fabric, and routing among CLBs are considered for future work. In this paper, we focused mostly on the fabric design.

4) New timing techniques (for clocking the CLBs) along with changes in routing channel structure can result in variations of the fabric for increasing the utilization percentage of the CLBs and/or frequency of operation.

For example, 1) having two more vertical routing channels will help in routing different P and G signals [e.g., $P_i^1$, $G_i^1$, $P_i^2$, $G_i^2$ in FIG. 14B] across several ALU blocks for the implementation of whole ALU. Otherwise, unavailability of vertical channels for routing across blocks due to the interconnections within a block results in under-utilization of CLBs; 2) some circuits (e.g. tree-based adders) have signals flowing among identical blocks in an organized manner. Phase-wise clocking of different blocks according to the signal flow can help in the reduction of buffer DFFs and/or in the overall latency of the implemented circuit.

1) Status of MJJs:

The implementation of MJJs and MJJ-based circuits is an active area of research and development primarily for applications in cryogenic magnetic random-access memories (MRAM). There have been many different versions of MJJs proposed and being developed over last several years [26]–[32], [38], [39] for MRAM. There has been a significant progress in the fabrication of MJJs including devices with comparatively complex layer structures. To a significant degree, the cryogenic MRAM implementation challenges are related to the efficient Read addressing schemes in the 2-D MRAM arrays that requires the integration of a "memory cell selector superconducting device" like SQUID [39] or a three-terminal device [24], [40] with an MJJ.

In contrast, the FPGA described in this paper has different and simpler requirements for MJJs and for the MJJ array described in programming layer. This array is a 2-D matrix in which all MJJs are connected in parallel to the FPGA logic layer. There is no Read function for an individual MJJ, but an application of bias current through all MJJs. The Write function is similar to that of the MRAM and is achieved by a simple crossbar configuration of the current lines (VAL and HAL). On a device level, the proposed FPGA requires the MJJ characteristic voltage (IJR) to be comparable to that of conventional Josephson junctions used in ERSFQ circuits. This is necessary for the correct operation of the MJJs as bias limiting junctions [41]. This requirement leads to the preference of MJJs with high $I_cR_n$ [29]-[32]. Some MJJs of this kind [29]-[31] have only one ferromagnetic layer that significantly simplifies its fabrication and increases the yield.

2) Implementation Considerations:

Implementation of the proposed magnetic SFQ FPGA would require co-fabrication of conventional superconductor-insulator-superconductor (SIS) junctions used in SFQ circuits, and MJJs. Such fabrication process has recently been demonstrated in which both types of junction are fabricated within a four-layer process [39]. A greater advantage will be achieved with MJJs and SIS JJs being located on the different vertically integrated layers similar to the double SIS JJ layer process recently developed in Japan [42]. Alternatively, one can use a multichip module (MCM) integration with the logic layer and programming layer implemented on different chips. However, this would require a large number of fully superconducting bump bonds. Currently, such MCM technology with superconducting bonds is demonstrated only for <4K operation [43]. Overall, the MCM integration approach appears to be more challenging and less scalable than the double-JJ layer integrated fabrication process described above.

V. Conclusion

We have designed the first superconducting energy-efficient magnetic FPGA. We used the ERSFQ biasing scheme in combination with MJJs to result in a switch implementation that can be programmed with an external current source. We have designed both an NDRO switch based and a magnetic switch based CLBs whose programming is done serially with the use of an SFQ scan chain in the CLB structure and with magnetic coupling through current in the crossbar structure made by the current lines, respectively. CLB is also designed for asynchronous operation without a higher cost along with synchronous operating CLBs. We have modified the CMOS switch box architecture and designed connection blocks appropriately in the context of a unidirectional SFQ FPGA. A programming methodology to program the critical current of MJJs to either low or high values is presented. We simulated all the designed circuits in WRSpice circuit simulator and verified the functionality of circuits. We have also built Verilog models for each FPGA sub-circuit for ease of simulation for the implementation of whole FPGA structure. To demonstrate the functionality of the proposed FPGA approach, a circuit containing all the building blocks of an ALU is synthesized, placed, and routed on the fabric. According to the estimations, our FPGA fabric takes much less area than the previous implementations.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

REFERENCES

[1] T. N. Theis and H.-S. P. Wong, "The end of Moore's law: A new beginning for information technology," *Comput. Sci. Eng.*, vol. 19, no. 2, pp. 41-50, 2017.

[2] D. S. Holmes, A. L. Ripple, and M. A. Manheimer, "Energy-efficient superconducting computing-Power budgets and requirements," *IEEE Trans. Appl. Supercond.*, vol. 23, no. 3, June 2013, Art. no. 1701610.

[3] M. A. Manheimer, "Cryogenic computing complexity program: Phase 1 introduction," *IEEE Trans. Appl. Supercond.*, vol. 25, no. 3, June 2015, Art. no. 1301704.

[4] K. K. Likharev and V. K. Semenov, "RSFQ logic/memory family: A new Josephson-junction technology for sub-terahertz-clock-frequency digital systems," *IEEE Trans. Appl. Supercond.*, vol. 1, no. 1, pp. 3-28, March 1991.

[5] G.-M. Tang, K. Takata, M. Tanaka, A. Fujimaki, K. Takagi, and N. Takagi, "4-bit bit-slice arithmetic logic unit for 32-bit RSFQ microprocessors," *IEEE Trans. Appl. Supercond.*, vol. 26, no. 1, January 2016, Art. no. 1300106.

[6] R. Sato et al., "High-Speed operation of random-access-memory-embedded microprocessor with minimal instruction set architecture based on rapid single-flux-quantum logic," *IEEE Trans. Appl. Supercond.*, vol. 27, no. 4, June 2017, Art. no. 1300505.

[7] T. V. Filippov et al., "20 GHz operation of an asynchronous wave-pipelined RSFQ arithmetic-logic unit," *Phys. Procedia*, vol. 36, pp. 59-65, 2012.

[8] O. A. Mukhanov et al., "Superconductor digital-RF receiver systems," *IEICE Trans. Electron.*, vol. 91, no. 3, pp. 306-317, 2008.

[9] O. A. Mukhanov, "Energy-efficient single flux quantum technology," *IEEE Trans. Appl. Supercond.*, vol. 21, no. 3, pp. 760-769, June 2011.

[10] D. Kirichenko, S. Sarwana, and A. Kirichenko, "Zero static power dissipation biasing of RSFQ circuits," *IEEE Trans. Appl. Supercond.*, vol. 21, no. 3, pp. 776-779, June 2011.

[11] M. H. Volkmann, A. Sahu, C. J. Fourie, and O. A. Mukhanov, "Implementation of energy efficient single flux quantum digital circuits with sub-aJ/bit operation," *Supercond. Sci. Technol.*, vol. 26, no. 1, 2012, Art. no. 015002.

[12] Q. P. Herr, A. Y. Herr, O. T. Oberg, and A. G. Ioannidis, "Ultra-low-power superconductor logic," *J. Appl. Phys.*, vol. 109, no. 10, 2011, Art. no. 103903.

[13] M. Tanaka, M. Ito, A. Kitayama, T. Kouketsu, and A. Fujimaki, "18-GHz, 4.0-aJ/bit operation of ultra-low-energy rapid single-flux-quantum shift registers," *Jpn. J. Appl. Phys.*, vol. 51, no. 5R, 2012, Art. no. 053102.

[14] N. Takeuchi, D. Ozawa, Y. Yamanashi, and N. Yoshikawa, "An adiabatic quantum flux parametron as an ultra-low-power logic device," *Supercond. Sci. Technol.*, vol. 26, no. 3, 2013, Art. no. 035010.

[15] I. Kuon, R. Tessier, and J. Rose, "FPGA architecture: Survey and challenges," *Found. Trends Electron. Des. Autom.*, vol. 2, no. 2, pp. 135-253, 2008.

[16] Farooq, Z. Marrakchi, and H. Mehrez, "FPGA architectures: An overview," in *Tree-Based Heterogeneous FPGA Architectures*. New York, N.Y., USA: Springer-Verlag, 2012, pp. 7-48.

[0] I. Conway Lamb et al., "An FPGA-based instrumentation platform for use at deep cryogenic temperatures," *Rev. Sci. Instrum.*, vol. 87, no. 1, 2016, Art. no. 014701.

[1] H. Homulle et al., "A reconfigurable cryogenic platform for the classical control of quantum processors," *Rev. Sci. Instrum.*, vol. 88, no. 4, 2017, Art. no. 045103.

[2] C. J. Fourie and H. van Heerden, "An RSFQ superconductive programmable gate array," *IEEE Trans. Appl. Supercond.*, vol. 17, no. 2, pp. 538-541, June 2007.

[3] W. R. Reohr and R. J. Voigt, "Superconducting cell array logic circuit system," U.S. Pat. No. 9,595,970, Mar. 14, 2017.

[4] A. Cosoroaba and F. Rivoallon, "Achieving higher system performance with the Virtex-5 family of FPGAs," White Paper: Virtex-5 Family of FPGAs, Xilinx WP245 (v1. 1.1), 2006.

[5] D. Singh, "Implementing FPGA design with the OpenCL standard," Altera whitepaper, 2011.

[6] I. P. Nevirkovets, O. Chernyashevskyy, G. V. Prokopenko, O. A. Mukhanov, and J. B. Ketterson, "Superconducting-ferromagnetic tran-sistor," IEEE Trans. Appl. Supercond., vol. 24, no. 4, August 2014, Art. no. 1800506.

[7] I. P. Nevirkovets, O. Chernyashevskyy, G. V. Prokopenko, O. A. Mukhanov, and J. B. Ketterson, "Control of supercurrent in hybrid superconducting-ferromagnetic transistors," IEEE Trans. Appl. Super-cond., vol. 25, no. 3, June 2015, Art. no. 1800705.

[8] S. J. Wilton, "Architectures and algorithms for field-programmable gate arrays with embedded memory," Ph.D. dissertation, Dept. Elect. Comput. Eng., Univ. Toronto, Toronto, ON, Canada, 1997.

[9] B. Baek, W. H. Rippard, S. P. Benz, S. E. Russek, and P. D. Dresselhaus, "Hybrid superconducting-magnetic memory device using competing order parameters," Nature Commun., vol. 5, 2014, Art. no. 3888.

[10] M. AbdEl Qader, R. Singh, S. N. Galvin, L. Yu, J. Rowell, andN. Newman, "Switching at small magnetic fields in Josephson junctions fabricated with ferromagnetic barrier layers," Appl. Phys. Lett., vol. 104, no. 2, 2014, Art. no. 022602.

[11] B. M. Niedzielski, E. Gingrich, R. Loloee, W. Pratt, and N. O. Birge, "S/F/S Josephson junctions with single-domain ferromagnets for memory applications," Supercond. Sci. Technol., vol. 28, no. 8, 2015, Art. no. 085012.

[12] T. I. Larkin et al., "Ferromagnetic Josephson switching device with high characteristic voltage," Appl. Phys. Lett., vol. 100, no. 22, 2012, Art. no. 222601.

[13] V. V. Ryazanov et al., "Magnetic Josephson junction technology for digital and memory applications," Phys. Procedia, vol. 36, pp. 35-41, 2012.

[14] I. V. Vernik et al., "Magnetic Josephson junctions with superconducting interlayer for cryogenic memory," IEEE Trans. Appl. Supercond., vol. 23, no. 3, June 2013, Art. no. 1701208.

[15] I. P. Nevirkovets and O. Mukhanov, "A memory cell for high density arrays based on multi-terminal superconducting-ferromagnetic device," presented at the 16th Int. Supercond. Electron. Conf., Sorrento, Italy, 2017.

[16] G. Cerofolini, "The crossbar structure," in Nanoscale Devices. Berlin, Germany: Springer-Verlag, 2009, pp. 45-52.

[17] I. Vernik, A. Kirichenko, O. Mukhanov, and T. Ohki, "Energy-efficient and compact ERSFQ decoder for cryogenic RAM," IEEE Trans. Appl. Supercond., vol. 27, no. 4, June 2017, Art. no. 1301205.

[18] A. Kirichenko, I. Vernik, O. Mukhanov, and T. Ohki, "ERSFQ 4-to-16 decoder for energy-efficient ram," IEEE Trans. Appl. Supercond., vol. 25, no. 3, June 2015, Art. no. 1301304.

[19] K. Gaj, E. G. Friedman, and M. J. Feldman, "Timing of multi-gigahertz rapid single flux quantum digital circuits," J. VLSI Signal Process. Syst. Signal, Image Video Technol., vol. 16, no. 2/3, pp. 247-276, 1997.

[20] N. Katam, A. Shafaei, and M. Pedram, "Design of complex rapid single-flux-quantum cells with application to logic synthesis," presented at the 16th Int. Supercond. Electron. Conf., Sorrento, Italy, 2017.

[21] E. Goldobin et al., "Memory cell based on a 4, Josephson junction," Appl. Physics Lett., vol. 102, no. 24, 2013, Art. no. 242602.

[22] I. Dayton et al., "Experimental demonstration of a Josephson magnetic memory cell with a programmable π-junction," arXiv: 1711.01681, 2017.

[23] A. N. McCaughan and K. K. Berggren, "A superconducting-nanowire three-terminal electrothermal device," Nano Lett., vol. 14, no. 10, pp. 5748-5753, 2014.

[24] C. Shawawreh et al., "Effects of adaptive DC biasing on operational margins in ERSFQ circuits," IEEE Trans. Appl. Supercond., vol. 27, no. 4, June 2017, Art. no. 1301606.

[42] T. Ando et al., "Three-dimensional adiabatic quantum-flux-parametron fabricated using a double-active-layered niobium process," Supercond. Sci. Technol., vol. 30, no. 7, 2017, Art. no. 075003.

[43] B. Foxen et al., "Qubit compatible superconducting interconnects," Quant. Sci. Technol., vol. 3, no. 1, 2017, Art. no. 014005.

What is claimed is:

1. A superconducting field programmable gate array (SuperFPGA) apparatus for implementing a superconducting electronic circuit, comprising:
    a superconducting logic core comprising a plurality of superconducting single flux quantum configurable logic blocks that includes regular Josephson junctions and inductors that are interconnectible to each other and to input/output terminals of the superconducting electronic circuit;
    a superconducting routing network comprising a collection of transmission lines, programmable connection blocks, and programmable switchboxes for realizing connections among the superconducting single flux quantum configurable logic blocks and input/output terminals;
    a zero-static-power dissipation biasing network for supplying desired amounts of biasing currents to the superconducting logic core and superconducting routing network;
    magnetic Josephson junctions used selectively in the zero-static-power dissipation biasing network to enable in-field programmability of the said superconducting logic core and superconducting routing network by changing amounts of locally-provided biasing currents; and
    a magnetic Josephson junction programming layer comprising of decoders and superconducting current-carrying lines to enable and effect selective setting of critical current levels of the magnetic Josephson junctions.

2. The SuperFPGA apparatus of claim 1 wherein circuit operates in a synchronous or asynchronous manner.

3. The SuperFPGA apparatus of claim 1 wherein the superconducting single flux quantum configurable logic blocks are programmable to perform a specific Boolean operation by changing biasing currents through the magnetic Josephson junction programming layer.

4. The SuperFPGA apparatus of claim 1 wherein the superconducting single flux quantum configurable logic blocks are look-up table based or a function selectable type.

5. The SuperFPGA apparatus of claim 4 wherein a lookup table based superconducting single flux quantum configurable logic block comprises:

a decoder that can decode a maximum number of inputs that a logic gate can have;

a plurality of magnetic Josephson junction-containing switches placed at each decoder output to selectively block or pass decoded outputs, each switch comprising regular and magnetic Josephson junctions and inductors; and a merge-block that merges the decoded outputs to realize Boolean function of the said logic gate at an output of the superconducting single flux quantum configurable logic blocks.

6. The SuperFPGA apparatus of claim 4 wherein a function selectable based superconducting single flux quantum configurable logic block comprises:

a plurality of a predetermined number of gates;

a plurality of splitters with switches that carry inputs to each of the gates, each splitter having a magnetic Josephson junction-containing switch at each splitter output, each switch comprising regular and magnetic Josephson junctions and inductors to selectively block or pass signals; and a merger circuit that mergers outputs from the gates to give a configurable logic block output.

7. The SuperFPGA apparatus of claim 1 wherein the programmable connection blocks and programmable switchboxes are programmable to provide selective connectivity among input or output channels and configurable logic blocks by the magnetic Josephson junction programming layer.

8. The SuperFPGA apparatus of claim 7 wherein the programmable switchboxes include splitters having a splitter input and 2 or more splitter outputs, each splitter output is directly connected to a magnetic Josephson junction-containing switch.

9. The SuperFPGA apparatus of claim 8 wherein the programmable switchboxes include merger circuits that combines 2 or more input signals into a merged output signal.

10. The SuperFPGA apparatus of claim 1 wherein the superconducting logic core is organized as a regular two-dimensional array of superconducting Single flux quantum configurable logic blocks.

11. The SuperFPGA apparatus of claim 1 wherein the superconducting routing network allows signal flow in horizonal or vertical directions in unidirectional or bidirectional manner.

12. The SuperFPGA apparatus of claim 1 wherein outputs of vertical connection blocks are routed to inputs of configurable logic blocks and outputs of the superconducting single flux quantum configurable logic blocks are routed to inputs of horizontal connection blocks.

13. The SuperFPGA apparatus of claim 3 wherein the superconducting routing network comprises vertical and horizontal connection blocks such that vertical connection blocks receive input data from connected vertical routing channels and selectively send output data to connected configurable logic block and horizontal connection blocks selectively connect horizontal channels to nearby configurable logic blocks.

14. The SuperFPGA apparatus of claim 1 wherein passive and Josephson transmission lines may be included in horizontal and vertical connection blocks.

15. The SuperFPGA apparatus of claim 1 wherein the zero-static-power dissipation biasing network is an energy-efficient rapid single flux quantum biasing network.

16. The SuperFPGA apparatus of claim 1, wherein magnetic Josephson junctions are placed in an array where programming of their critical current level is achieved by controlling current flow through current-carrying lines of a cross-bar structure with each intersection points of the cross-bar corresponding to a specific magnetic Josephson junction of the array.

17. The SuperFPGA apparatus of claim 16 wherein the superconducting routing network allows signal flow in horizonal or vertical directions of the array in unidirectional or bidirectional manner.

18. The SuperFPGA apparatus of claim 2 wherein distribution of clock pulses for synchronous circuit operation is achieved by various clock distribution schemes, including zero-skew, concurrent flow, counter flow, and clock-follow-data.

19. The SuperFPGA apparatus of claim 18 wherein the superconducting logic core as organized as a regular two-dimensional array of superconducting single flux quantum configurable logic blocks.

20. The SuperFPGA apparatus of claim 19 wherein clock pulse distribution for synchronous operation is achieved using a clock-follow-data scheme such that logic circuits including logic gates are each mapped to a configurable logic block in the superconducting logic core in such a way that logic gates with a same logical depth lie in one or more consecutive columns of the regular two-dimensional array of superconducting single flux quantum configurable logic blocks.

21. The SuperFPGA apparatus of claim 18 wherein a clock-follow-data scheme can be used for reset-pulse distribution in case of operation in an asynchronous wave-pipelined manner.

22. A method of enabling in-field programmability of a superconducting field programmable logic circuit, comprising:

receiving programming data describing a desired functionality of the superconducting field programmable logic circuit;

decoding the programming data to produce a bit stream for programming individual configurable logic blocks and interconnections among configurable logic blocks and primary inputs/outputs of the superconducting field programmable logic circuit; and processing the bit stream by selectively changing a magnitude of a current flowing in a superconducting line to cause a change in a critical current level of a nearby magnetic Josephson junction, the change causing a corresponding a change in biasing current level supplied to a target superconducting programmable logic or interconnect element wherein the interconnections that are programmed include programmable connection blocks and programmable switchboxes that are programmable to provide selective connectivity among input or output routing channels and configurable logic blocks.

23. The method of claim 22 wherein individual logic cells are programmed includes superconducting single flux quantum configurable logic blocks that are interconnectible to each other and to input/output terminals of the superconducting field programmable logic circuit.

24. The method of claim 23 wherein the superconducting single flux quantum configurable logic blocks are programmable to perform a specific Boolean operation.

25. The method of claim 24 wherein the superconducting single flux quantum configurable logic blocks are look-up table based or a function selectable type.

26. The method of claim 25 wherein a lookup table based superconducting single flux quantum configurable logic block comprises:
   a decoder that can decode a maximum number of inputs that a logic gate can have;
   a plurality of magnetic Josephson junctions such that a magnetic Josephson junction-containing switches placed at each decoder output to selectively block or pass decoded outputs, each switch comprising regular and magnetic Josephson junctions and inductors; and
   a merge-block that merges the decoded outputs to realize Boolean function of the logic gate at an output of the superconducting single flux quantum configurable logic blocks.

27. The method of claim 25 wherein a function selectable based superconducting single flux quantum configurable logic block comprises:
   a plurality of a predetermined number of gates;
   a plurality of splitters with switches that carry inputs to each of the gates, each splitter having a magnetic Josephson junction-containing switch at each splitter output, each switch comprising regular and magnetic Josephson junctions and inductors to selectively block or pass signals; and
   a merger circuit that mergers outputs from the gates to give a configurable logic block output.

28. The method of claim 22 wherein the programmable switchboxes include splitters having a splitter input and 2 or more splitter outputs, each splitter output being direct to a magnetic Josephson junction-containing switch.

29. The method of claim 22 wherein the programmable switchboxes include merger circuits that combines 2 or more input signals into a merged output signal.

30. The method of claim 27 wherein the function selectable based superconducting single flux quantum configurable logic block implements non-combinational logic gates such as a Muller C-element.

31. The method of claim 27 wherein the superconducting field programmable logic circuit also includes configurable logic blocks producing more than one output.

32. The method of claim 22 wherein program decoders used for decoding programming data to produce the bit stream for programming individual configurable logic blocks and interconnections among configurable logic blocks and primary inputs/outputs of the superconducting field programmable logic circuit can be either single-flux quantum based or CMOS based circuits.

33. The method of claim 32 wherein inputs to the program decoders can be provided either in parallel or serially.

* * * * *